(12) United States Patent
Lee et al.

(10) Patent No.: US 8,036,014 B2
(45) Date of Patent: Oct. 11, 2011

(54) PHASE CHANGE MEMORY PROGRAM METHOD WITHOUT OVER-RESET

(75) Inventors: Ming-Hsiu Lee, Hsinchu (TW); Matthew J. Breitwisch, Yorktown Heights, NY (US); Chung Hon Lam, Peekskill, NY (US)

(73) Assignees: Macronix International Co., Ltd., Hsinchu (TW); International Business Machines Corporation, Armonk, NY (US)

( * ) Notice: Subject to any disclaimer, the term of this patent is extended or adjusted under 35 U.S.C. 154(b) by 284 days.

(21) Appl. No.: 12/266,222

(22) Filed: Nov. 6, 2008

(65) Prior Publication Data
US 2010/0110778 A1    May 6, 2010

(51) Int. Cl.
G11C 11/00    (2006.01)
G11C 11/36    (2006.01)
(52) U.S. Cl. .................. 365/148; 365/163; 365/175
(58) Field of Classification Search .................. 365/148, 365/163, 175
See application file for complete search history.

(56) References Cited

U.S. PATENT DOCUMENTS

| | | | |
|---|---|---|---|
| 3,271,591 A * | 9/1966 | Ovshinsky | |
| 3,530,441 A * | 9/1970 | Ovshinsky | |
| 3,922,648 A * | 11/1975 | Buckley | 365/163 |
| 4,225,946 A * | 9/1980 | Neale et al. | 365/163 |
| 4,228,524 A * | 10/1980 | Neale et al. | 365/163 |
| 4,452,592 A * | 6/1984 | Tsai | |
| 4,599,705 A * | 7/1986 | Holmberg et al. | |
| 4,719,594 A * | 1/1988 | Young et al. | |
| 4,769,339 A * | 9/1988 | Ishii et al. | |
| 4,876,220 A * | 10/1989 | Mohsen et al. | |
| 4,959,812 A * | 9/1990 | Momodomi et al. | |
| 5,106,775 A * | 4/1992 | Kaga et al. | |
| 5,166,096 A * | 11/1992 | Cote et al. | |
| 5,166,758 A * | 11/1992 | Ovshinsky et al. | |
| 5,177,567 A * | 1/1993 | Klersy et al. | |
| 5,332,923 A * | 7/1994 | Takeuchi et al. | |
| 5,391,901 A * | 2/1995 | Tanabe et al. | |
| 5,515,488 A * | 5/1996 | Hoppe et al. | |
| 5,534,712 A * | 7/1996 | Ovshinsky et al. | |
| 5,550,396 A | 8/1996 | Tsutsumi et al. | |
| 5,596,522 A * | 1/1997 | Ovshinsky et al. | 365/163 |
| 5,687,112 A | 11/1997 | Ovshinsky | |

(Continued)

FOREIGN PATENT DOCUMENTS
WO    WO-0079539    12/2000
(Continued)

OTHER PUBLICATIONS

"Magnetic Bit Boost," www.sciencenews.org, Dec. 18 & 25, 2004, p. 389, vol. 166.

(Continued)

*Primary Examiner* — Trong Phan
(74) *Attorney, Agent, or Firm* — Haynes Beffel & Wolfeld LLP

(57) ABSTRACT

Memory devices and methods for operating such devices are described herein. A method as described herein includes applying a fixed sequence of voltage pulses across the memory cell of increasing pulse height to change the resistance state from the lower resistance state to the higher resistance state. The fixed sequence of voltage pulses cause increasing current through the phase change memory element until change to the higher resistance state occurs, and after the change the voltage pulses in the fixed sequence causing a voltage across the phase change memory element less than the threshold voltage.

32 Claims, 18 Drawing Sheets

U.S. PATENT DOCUMENTS

| | | |
|---|---|---|
| 5,688,713 A | 11/1997 | Linliu et al. |
| 5,716,883 A | 2/1998 | Tseng et al. |
| 5,754,472 A | 5/1998 | Sim et al. |
| 5,789,277 A | 8/1998 | Zahorik et al. |
| 5,789,758 A | 8/1998 | Reinberg |
| 5,814,527 A | 9/1998 | Wolstenholme et al. |
| 5,831,276 A | 11/1998 | Gonzalez et al. |
| 5,837,564 A | 11/1998 | Sandhu et al. |
| 5,869,843 A | 2/1999 | Harshfield |
| 5,879,955 A | 3/1999 | Gonzalez et al. |
| 5,902,704 A | 5/1999 | Schoenborn et al. |
| 5,920,788 A | 7/1999 | Reinberg |
| 5,933,365 A | 8/1999 | Klersy et al. |
| 5,952,671 A | 9/1999 | Reinberg et al. |
| 5,958,358 A | 9/1999 | Tenne et al. |
| 5,970,336 A | 10/1999 | Wolstenholme et al. |
| 5,985,698 A | 11/1999 | Gonzalez et al. |
| 5,998,244 A | 12/1999 | Wolstenholme et al. |
| 6,011,725 A | 1/2000 | Eitan et al. |
| 6,025,220 A | 2/2000 | Sandhu |
| 6,031,287 A | 2/2000 | Harshfield |
| 6,034,882 A | 3/2000 | Johnson et al. |
| 6,046,951 A | 4/2000 | El Hajji et al. |
| 6,066,870 A | 5/2000 | Siek |
| 6,077,674 A | 6/2000 | Schleifer et al. |
| 6,077,729 A | 6/2000 | Harshfield |
| 6,087,269 A | 7/2000 | Williams |
| 6,087,674 A | 7/2000 | Ovshinsky et al. |
| 6,104,038 A | 8/2000 | Gonzalez et al. |
| 6,111,264 A | 8/2000 | Wolstenholme et al. |
| 6,114,713 A | 9/2000 | Zahorik |
| 6,117,720 A | 9/2000 | Harshfield |
| 6,147,395 A | 11/2000 | Gilgen |
| 6,150,253 A | 11/2000 | Doan et al. |
| 6,153,890 A | 11/2000 | Wolstenholme et al. |
| 6,177,317 B1 | 1/2001 | Huang et al. |
| 6,185,122 B1 | 2/2001 | Johnson et al. |
| 6,189,582 B1 | 2/2001 | Reinberg et al. |
| 6,236,059 B1 | 5/2001 | Wolstenholme et al. |
| RE37,259 E | 7/2001 | Ovshinsky |
| 6,271,090 B1 | 8/2001 | Huang et al. |
| 6,280,684 B1 | 8/2001 | Yamada et al. |
| 6,287,887 B1 | 9/2001 | Gilgen |
| 6,291,137 B1 | 9/2001 | Lyons et al. |
| 6,314,014 B1 | 11/2001 | Lowrey et al. |
| 6,316,348 B1 | 11/2001 | Fu et al. |
| 6,320,786 B1 | 11/2001 | Chang et al. |
| 6,326,307 B1 | 12/2001 | Lindley et al. |
| 6,337,266 B1 | 1/2002 | Zahorik |
| 6,339,544 B1 | 1/2002 | Chiang et al. |
| 6,351,406 B1 | 2/2002 | Johnson et al. |
| 6,372,651 B1 | 4/2002 | Yang et al. |
| 6,380,068 B2 | 4/2002 | Jeng et al. |
| 6,420,215 B1 | 7/2002 | Knall et al. |
| 6,420,216 B1 | 7/2002 | Clevenger et al. |
| 6,420,725 B1 | 7/2002 | Harshfield |
| 6,423,621 B2 | 7/2002 | Doan et al. |
| 6,429,064 B1 | 8/2002 | Wicker |
| 6,440,837 B1 | 8/2002 | Harshfield |
| 6,462,353 B1 | 10/2002 | Gilgen |
| 6,483,736 B2 | 11/2002 | Johnson et al. |
| 6,487,106 B1 | 11/2002 | Kozicki |
| 6,487,114 B2 | 11/2002 | Jong et al. |
| 6,501,111 B1 | 12/2002 | Lowrey |
| 6,511,867 B2 | 1/2003 | Lowrey et al. |
| 6,512,241 B1 | 1/2003 | Lai |
| 6,514,788 B2 | 2/2003 | Quinn |
| 6,514,820 B2 | 2/2003 | Ahn et al. |
| 6,534,781 B2 | 3/2003 | Dennison |
| 6,545,903 B1 | 4/2003 | Wu |
| 6,551,866 B1 | 4/2003 | Maeda et al. |
| 6,555,860 B2 | 4/2003 | Lowrey et al. |
| 6,563,156 B2 | 5/2003 | Harshfield |
| 6,566,700 B2 | 5/2003 | Xu |
| 6,567,293 B1 | 5/2003 | Lowrey et al. |
| 6,576,546 B2 * | 6/2003 | Gilbert et al. |
| 6,579,760 B1 * | 6/2003 | Lung et al. |
| 6,586,761 B2 * | 7/2003 | Lowrey |
| 6,589,714 B2 * | 7/2003 | Maimon et al. |
| 6,593,176 B2 * | 7/2003 | Dennison |
| 6,596,589 B2 * | 7/2003 | Tseng et al. |
| 6,597,009 B2 * | 7/2003 | Wicker |
| 6,605,527 B2 * | 8/2003 | Dennison et al. |
| 6,605,821 B1 * | 8/2003 | Lee et al. |
| 6,607,974 B2 * | 8/2003 | Harshfield |
| 6,613,604 B2 * | 9/2003 | Maimon et al. |
| 6,617,192 B1 * | 9/2003 | Lowrey et al. |
| 6,621,095 B2 * | 9/2003 | Chiang et al. |
| 6,627,530 B2 * | 9/2003 | Li et al. |
| 6,639,849 B2 * | 10/2003 | Takahashi et al. |
| 6,673,700 B2 * | 1/2004 | Dennison et al. |
| 6,674,115 B2 * | 1/2004 | Hudgens et al. |
| 6,677,678 B2 * | 1/2004 | Biolsi et al. |
| 6,744,088 B1 * | 6/2004 | Dennison |
| 6,750,079 B2 * | 6/2004 | Lowrey et al. |
| 6,750,101 B2 * | 6/2004 | Lung et al. |
| 6,791,102 B2 * | 9/2004 | Johnson et al. |
| 6,797,979 B2 * | 9/2004 | Chiang et al. |
| 6,800,504 B2 * | 10/2004 | Li et al. |
| 6,800,563 B2 * | 10/2004 | Xu |
| 6,815,704 B1 * | 11/2004 | Chen |
| 6,838,692 B1 * | 1/2005 | Lung et al. |
| 6,850,432 B2 * | 2/2005 | Lu et al. |
| 6,859,389 B2 * | 2/2005 | Idehara et al. |
| 6,861,267 B2 * | 3/2005 | Xu et al. |
| 6,864,500 B2 * | 3/2005 | Gilton |
| 6,864,503 B2 * | 3/2005 | Lung et al. |
| 6,867,638 B2 * | 3/2005 | Saiki et al. |
| 6,881,603 B2 * | 4/2005 | Lai |
| 6,888,750 B2 * | 5/2005 | Walker et al. |
| 6,894,304 B2 * | 5/2005 | Moore |
| 6,894,305 B2 * | 5/2005 | Yi et al. |
| 6,900,517 B2 * | 5/2005 | Tanaka et al. |
| 6,903,362 B2 | 6/2005 | Wyeth et al. |
| 6,909,107 B2 | 6/2005 | Rodgers et al. |
| 6,910,907 B2 | 6/2005 | Layadi et al. |
| 6,927,410 B2 | 8/2005 | Chen |
| 6,928,022 B2 | 8/2005 | Cho et al. |
| 6,933,516 B2 | 8/2005 | Xu |
| 6,936,544 B2 | 8/2005 | Huang et al. |
| 6,936,840 B2 | 8/2005 | Sun et al. |
| 6,937,507 B2 | 8/2005 | Chen |
| 6,943,365 B2 | 9/2005 | Lowrey et al. |
| 6,967,865 B2 * | 11/2005 | Lee ............................... 365/163 |
| 6,969,866 B1 | 11/2005 | Lowrey et al. |
| 6,972,428 B2 | 12/2005 | Maimon |
| 6,972,430 B2 | 12/2005 | Casagrande et al. |
| 6,977,181 B1 | 12/2005 | Raberg et al. |
| 6,992,932 B2 | 1/2006 | Cohen et al. |
| 7,012,834 B2 | 3/2006 | Cho et al. |
| 7,020,014 B2 * | 3/2006 | Khouri et al. ................. 365/163 |
| 7,023,009 B2 | 4/2006 | Kostylev et al. |
| 7,033,856 B2 | 4/2006 | Lung et al. |
| 7,038,230 B2 | 5/2006 | Chen et al. |
| 7,038,938 B2 | 5/2006 | Kang et al. |
| 7,042,001 B2 | 5/2006 | Kim et al. |
| 7,054,183 B2 | 5/2006 | Rinerson et al. |
| 7,067,837 B2 | 6/2006 | Hwang et al. |
| 7,067,864 B2 | 6/2006 | Nishida et al. |
| 7,067,865 B2 | 6/2006 | Lung et al. |
| 7,078,273 B2 | 7/2006 | Matsuoka et al. |
| 7,085,154 B2 | 8/2006 | Cho et al. |
| 7,099,180 B1 | 8/2006 | Dodge et al. |
| 7,110,286 B2 | 9/2006 | Choi et al. |
| 7,115,927 B2 | 10/2006 | Hideki et al. |
| 7,122,281 B2 | 10/2006 | Pierrat |
| 7,122,824 B2 | 10/2006 | Khouri et al. |
| 7,126,149 B2 | 10/2006 | Iwasaki et al. |
| 7,130,214 B2 * | 10/2006 | Lee ............................... 365/163 |
| 7,132,675 B2 | 11/2006 | Gilton |
| 7,151,273 B2 | 12/2006 | Campbell et al. |
| 7,154,774 B2 | 12/2006 | Bedeschi et al. |
| 7,164,147 B2 | 1/2007 | Lee et al. |
| 7,166,533 B2 | 1/2007 | Happ |
| 7,169,635 B2 | 1/2007 | Kozicki |
| 7,190,607 B2 | 3/2007 | Cho et al. |
| 7,202,493 B2 * | 4/2007 | Lung et al. |

| Patent/Pub No. | Date | Inventor |
|---|---|---|
| 7,208,751 B2* | 4/2007 | Ooishi et al. |
| 7,214,958 B2* | 5/2007 | Happ |
| 7,220,983 B2* | 5/2007 | Lung |
| 7,229,883 B2* | 6/2007 | Wang et al. |
| 7,238,959 B2* | 7/2007 | Chen |
| 7,238,994 B2* | 7/2007 | Chen et al. |
| 7,248,494 B2* | 7/2007 | Oh et al. |
| 7,251,157 B2* | 7/2007 | Osada et al. |
| 7,253,429 B2* | 8/2007 | Klersy et al. |
| 7,254,059 B2* | 8/2007 | Li et al. |
| 7,262,990 B2* | 8/2007 | Cho et al. |
| 7,269,052 B2* | 9/2007 | Segal et al. |
| 7,277,317 B2* | 10/2007 | Le Phan et al. |
| 7,289,351 B1* | 10/2007 | Chen et al. ............ 365/163 |
| 7,291,556 B2* | 11/2007 | Choi et al. |
| 7,309,630 B2* | 12/2007 | Fan et al. |
| 7,321,130 B2* | 1/2008 | Lung et al. |
| 7,323,708 B2* | 1/2008 | Lee et al. |
| 7,332,370 B2* | 2/2008 | Chang et al. |
| 7,336,526 B2 | 2/2008 | Osada et al. |
| 7,351,648 B2 | 4/2008 | Furukawa et al. |
| 7,359,231 B2 | 4/2008 | Venkataraman et al. |
| 7,364,935 B2 | 4/2008 | Lung et al. |
| 7,365,385 B2 | 4/2008 | Abbott |
| 7,379,328 B2 | 5/2008 | Osada et al. |
| 7,385,235 B2 | 6/2008 | Lung et al. |
| 7,391,642 B2* | 6/2008 | Gordon et al. ............ 365/163 |
| 7,394,088 B2 | 7/2008 | Lung |
| 7,397,060 B2 | 7/2008 | Lung |
| 7,423,300 B2 | 9/2008 | Lung et al. |
| 7,426,134 B2 | 9/2008 | Happ et al. |
| 7,440,308 B2 | 10/2008 | Jeong et al. |
| 7,440,315 B2* | 10/2008 | Lung ............ 365/163 |
| 7,449,710 B2 | 11/2008 | Lung |
| 7,473,576 B2 | 1/2009 | Lung |
| 7,479,649 B2 | 1/2009 | Lung |
| 7,505,330 B2 | 3/2009 | Pawlowski et al. |
| 7,515,460 B2* | 4/2009 | Gordon et al. ............ 365/163 |
| 7,571,901 B2* | 8/2009 | Philipp ............ 365/163 |
| 7,623,370 B2* | 11/2009 | Toda et al. ............ 365/163 |
| 7,656,701 B2* | 2/2010 | Lee et al. ............ 365/163 |
| 7,767,993 B2* | 8/2010 | Toda et al. ............ 365/163 |
| 7,778,063 B2* | 8/2010 | Brubaker et al. ............ 365/163 |
| 7,778,066 B2* | 8/2010 | Horii et al. ............ 365/148 |
| 7,817,475 B2* | 10/2010 | Lowrey ............ 365/148 |
| 7,898,847 B2* | 3/2011 | Philipp ............ 365/163 |
| 7,907,435 B2* | 3/2011 | Osada et al. ............ 365/148 |
| 7,916,524 B2* | 3/2011 | Happ et al. ............ 365/163 |
| 7,929,336 B2* | 4/2011 | Philipp et al. ............ 365/163 |
| 2002/0070457 A1 | 6/2002 | Sun et al. |
| 2002/0113273 A1 | 8/2002 | Hwang et al. |
| 2003/0072195 A1 | 4/2003 | Mikolajick |
| 2003/0095426 A1 | 5/2003 | Hush et al. |
| 2003/0186481 A1 | 10/2003 | Lung |
| 2004/0026686 A1 | 2/2004 | Lung |
| 2004/0051094 A1 | 3/2004 | Ooishi |
| 2004/0113137 A1 | 6/2004 | Lowrey |
| 2004/0165422 A1 | 8/2004 | Hideki et al. |
| 2004/0248339 A1 | 12/2004 | Lung |
| 2004/0256610 A1 | 12/2004 | Lung |
| 2005/0018526 A1 | 1/2005 | Lee |
| 2005/0029502 A1 | 2/2005 | Hudgens |
| 2005/0062087 A1 | 3/2005 | Chen et al. |
| 2005/0093022 A1 | 5/2005 | Lung |
| 2005/0127349 A1 | 6/2005 | Horak et al. |
| 2005/0145984 A1 | 7/2005 | Chen et al. |
| 2005/0167656 A1 | 8/2005 | Sun et al. |
| 2005/0191804 A1 | 9/2005 | Lai et al. |
| 2005/0201182 A1 | 9/2005 | Osada et al. |
| 2005/0212024 A1 | 9/2005 | Happ |
| 2005/0212026 A1 | 9/2005 | Chung et al. |
| 2005/0215009 A1 | 9/2005 | Cho |
| 2005/0263829 A1 | 12/2005 | Song et al. |
| 2006/0006472 A1 | 1/2006 | Jiang |
| 2006/0034112 A1 | 2/2006 | Oh et al. |
| 2006/0038221 A1 | 2/2006 | Lee et al. |
| 2006/0066156 A1 | 3/2006 | Dong et al. |
| 2006/0073642 A1 | 4/2006 | Yeh et al. |
| 2006/0091476 A1 | 5/2006 | Pinnow et al. |
| 2006/0094154 A1 | 5/2006 | Lung |
| 2006/0108667 A1 | 5/2006 | Lung |
| 2006/0110878 A1 | 5/2006 | Lung et al. |
| 2006/0110888 A1 | 5/2006 | Cho et al. |
| 2006/0113520 A1 | 6/2006 | Yamamoto et al. |
| 2006/0113521 A1 | 6/2006 | Lung |
| 2006/0118913 A1 | 6/2006 | Yi et al. |
| 2006/0124916 A1 | 6/2006 | Lung |
| 2006/0126395 A1 | 6/2006 | Chen et al. |
| 2006/0131555 A1 | 6/2006 | Liu et al. |
| 2006/0138467 A1 | 6/2006 | Lung |
| 2006/0154185 A1 | 7/2006 | Ho et al. |
| 2006/0157681 A1 | 7/2006 | Chen et al. |
| 2006/0163554 A1 | 7/2006 | Lankhorst et al. |
| 2006/0172067 A1 | 8/2006 | Ovshinsky et al. |
| 2006/0175599 A1 | 8/2006 | Happ |
| 2006/0198183 A1 | 9/2006 | Kawahara et al. |
| 2006/0205108 A1 | 9/2006 | Maimon et al. |
| 2006/0211165 A1 | 9/2006 | Hwang et al. |
| 2006/0226409 A1 | 10/2006 | Burr et al. |
| 2006/0234138 A1 | 10/2006 | Fehlhaber et al. |
| 2006/0237756 A1 | 10/2006 | Park et al. |
| 2006/0261392 A1 | 11/2006 | Lee et al. |
| 2006/0266993 A1 | 11/2006 | Suh et al. |
| 2006/0284157 A1 | 12/2006 | Chen et al. |
| 2006/0284158 A1 | 12/2006 | Lung et al. |
| 2006/0284214 A1 | 12/2006 | Chen |
| 2006/0284279 A1 | 12/2006 | Lung et al. |
| 2006/0286709 A1 | 12/2006 | Lung et al. |
| 2006/0286743 A1 | 12/2006 | Lung et al. |
| 2006/0289848 A1 | 12/2006 | Dennison |
| 2007/0008786 A1 | 1/2007 | Scheuerlein |
| 2007/0030721 A1 | 2/2007 | Segal et al. |
| 2007/0037101 A1 | 2/2007 | Morioka |
| 2007/0096162 A1 | 5/2007 | Happ et al. |
| 2007/0096248 A1 | 5/2007 | Philipp et al. |
| 2007/0108077 A1 | 5/2007 | Lung et al. |
| 2007/0108429 A1 | 5/2007 | Lung |
| 2007/0108430 A1 | 5/2007 | Lung |
| 2007/0108431 A1 | 5/2007 | Chen et al. |
| 2007/0109836 A1 | 5/2007 | Lung |
| 2007/0109843 A1 | 5/2007 | Lung et al. |
| 2007/0111429 A1 | 5/2007 | Lung |
| 2007/0115794 A1 | 5/2007 | Lung |
| 2007/0117315 A1 | 5/2007 | Lai et al. |
| 2007/0120104 A1 | 5/2007 | Ahn et al. |
| 2007/0121363 A1 | 5/2007 | Lung |
| 2007/0121374 A1 | 5/2007 | Lung et al. |
| 2007/0126040 A1 | 6/2007 | Lung |
| 2007/0131922 A1 | 6/2007 | Lung |
| 2007/0138458 A1 | 6/2007 | Lung |
| 2007/0140029 A1 | 6/2007 | Kim et al. |
| 2007/0147105 A1 | 6/2007 | Lung et al. |
| 2007/0153563 A1 | 7/2007 | Nirschl |
| 2007/0154847 A1 | 7/2007 | Chen et al. |
| 2007/0155172 A1 | 7/2007 | Lai et al. |
| 2007/0158632 A1 | 7/2007 | Ho |
| 2007/0158633 A1 | 7/2007 | Lai et al. |
| 2007/0158645 A1 | 7/2007 | Lung |
| 2007/0158690 A1 | 7/2007 | Ho et al. |
| 2007/0158862 A1 | 7/2007 | Lung |
| 2007/0161186 A1 | 7/2007 | Ho |
| 2007/0170881 A1 | 7/2007 | Noh et al. |
| 2007/0171705 A1 | 7/2007 | Parkinson |
| 2007/0173019 A1 | 7/2007 | Ho et al. |
| 2007/0173063 A1 | 7/2007 | Lung |
| 2007/0176261 A1 | 8/2007 | Lung |
| 2007/0187664 A1* | 8/2007 | Happ |
| 2007/0201267 A1* | 8/2007 | Happ et al. |
| 2007/0215852 A1* | 9/2007 | Lung |
| 2007/0224726 A1 | 9/2007 | Chen et al. |
| 2007/0235811 A1* | 10/2007 | Furukawa et al. |
| 2007/0236989 A1* | 10/2007 | Lung |
| 2007/0246699 A1* | 10/2007 | Lung |
| 2007/0249090 A1* | 10/2007 | Philipp et al. |
| 2007/0257300 A1* | 11/2007 | Ho et al. |
| 2007/0262388 A1* | 11/2007 | Ho et al. |
| 2007/0274121 A1* | 11/2007 | Lung et al. |
| 2007/0285960 A1* | 12/2007 | Lung et al. |

| | | | |
|---|---|---|---|
| 2007/0298535 A1* | 12/2007 | Lung | |
| 2008/0006811 A1* | 1/2008 | Philipp et al. | |
| 2008/0012000 A1* | 1/2008 | Harshfield | |
| 2008/0014676 A1* | 1/2008 | Lung et al. | |
| 2008/0025089 A1* | 1/2008 | Scheuerlein et al. | |
| 2008/0043520 A1* | 2/2008 | Chen | |
| 2008/0094871 A1* | 4/2008 | Parkinson | |
| 2008/0101110 A1 | 5/2008 | Happ et al. | |
| 2008/0137400 A1 | 6/2008 | Chen et al. | |
| 2008/0164453 A1 | 7/2008 | Breitwisch et al. | |
| 2008/0165569 A1 | 7/2008 | Chen et al. | |
| 2008/0165570 A1 | 7/2008 | Happ et al. | |
| 2008/0165572 A1 | 7/2008 | Lung | |
| 2008/0166875 A1 | 7/2008 | Lung | |
| 2008/0179582 A1 | 7/2008 | Burr et al. | |
| 2008/0180990 A1 | 7/2008 | Lung | |
| 2008/0186755 A1 | 8/2008 | Lung et al. | |
| 2008/0191187 A1 | 8/2008 | Lung et al. | |
| 2008/0192534 A1 | 8/2008 | Lung | |
| 2008/0197334 A1 | 8/2008 | Lung | |
| 2008/0224119 A1 | 9/2008 | Burr et al. | |
| 2008/0225489 A1 | 9/2008 | Cai et al. | |
| 2008/0265234 A1 | 10/2008 | Breitwisch et al. | |
| 2009/0001341 A1 | 1/2009 | Breitwisch et al. | |
| 2009/0014704 A1 | 1/2009 | Chen et al. | |
| 2009/0023242 A1 | 1/2009 | Lung | |
| 2009/0027950 A1* | 1/2009 | Lam et al. | |
| 2009/0042335 A1* | 2/2009 | Lung | |
| 2009/0057641 A1* | 3/2009 | Lung | |
| 2009/0273968 A1 | 11/2009 | Lamorey et al. | |

FOREIGN PATENT DOCUMENTS

| | | |
|---|---|---|
| WO | WO-0145108 | 6/2001 |
| WO | WO-0225733 | 3/2002 |

OTHER PUBLICATIONS

"New Memories Tap Spin, Gird for Battle," Science News, Apr. 3, 1999, p. 223, vol. 155.
"Optimized Thermal Capacitance in a Phase Change Memory Cell Design," IPCOM000141986D, IP.com Prior Art Database, Oct. 18, 2006, 4pp.
"Remembering on the Cheap," www.sciencenews.org, Mar. 19, 2005, p. 189, vol. 167.
"Thermal Conductivity of Crystalline Dielectrics" in CRC Handbook of Chemistry and Physics, Internet Version 2007, (87th edition), David R. Lide, ed. Taylor and Francis, Boca Raton, Fl, 2pp.
Adler, D. et al., "Threshold Switching in Chalcogenide-Glass Thin Films," J. Appl/Phys 51(6), Jun. 1980, pp. 3289-3309.
Adler, David, "Amorphous-Semiconductor Devices," Sci. Amer., vol. 236, pp. 36-48, May 1977.
Ahn, S. J. et al., "A Highly Manufacturable High Density Phase Change Memory of 64 Mb and Beyond," IEEE IEDM 2004, pp. 907-910.
Ahn, S. J. et al., "Highly Reliable 5nm Contact Cell Technology for 256Mb PRAM," VLSI Technology, Digest of Technical Papers, Jun. 14-16, 2005, pp. 98-99.
Atwood, G, et al., "90 nm Phase Change Technology with u Trench and Lance Cell Elements," VLSI Technology, Systems and Applications, Apr. 23-25, 2007, pp. 1-2.
Axon Technologies Corporation paper: Technology Description, published in 1997, pp. 1-6.
Bedeschi, F. et al., "4-MB MOSFET-Selected Phase-Change Memory Experimental Chip," IEEE, 2004, 4 PP.
Blake thesis, "Investigation of GeTeSb5 Chalcogenide Films for Use as an Analog Memory," AFIT/GE/ENG/00M-04, Mar. 2000, 121 pages.
Chao, Der-Sheng, et al., "Low Programming Current Phase Change Memory Cell with Double GST Thermally Confined Structure," Int'l Symp on VLSI Technology, Systems and Applications, Apr. 23-25, 2007, pp. 1-2.
Chen, An et al., "Non-Volatile Resistive Switching for Advanced Memory Applications," IEEE IEDM, Dec. 5-7, 2005, 4 pp.
Cho, S. L. et al., "Highly Scalable On-axis Confined Cell Structure for High Density PRAM beyond 256Mb," 2005 Symposium on VLSI Technology Digest of Technical Papers, pp. 96-97.
Gibson, G. A. et al., "Phase-change Recording Medium that Enables Ultrahigh-density Electron-beam Data Storage," Applied Physics Letter, 2005, 3 pp., vol. 86.
Gill, Manzur et al., "A High-Performance Nonvolatile Memory Technology for Stand-Alone Memory and Embedded Applications," 2002 IEEE-ISSCC Technical Digest (TD 12.4), 7 pp.
Gleixner, "Phase Change Memory Reliability", 22nd NVSMW, Aug. 26, 2007, 46 pages.
Ha, Y. H. et al., "An Edge Contact Type Cell for Phase Change RAM Featuring Very Low Power Consumption," 2003 Symposium on VLSI Technology Digest of Technical Papers, pp. 175-176.
Happ, T. D. et al., "Novel None-Mask Self-Heating Pillar Phase Change Memory," 2006 Symposium on VLSI Technology, 2 pp.
Haring Bolivar, P. et al., "Lateral Design for Phase Change Random Access Memory Cells with Low-Current Consumption," presented at 3rd E*PCOS 04 Symposium in Balzers, Principality of Liechtenstein, Sep. 4-7, 2004, 4pp.
Horii, H. et al., "A Novel Cell Technology Using N-doped GeSbTe Films for Phase Change RAM," 2003 Symposium on VLSI Technology Digest of Technical Papers, pp. 177-178.
Hudgens, S. et al., "Overview of Phase-Change Chalcogenide Nonvolatile Memory Technology," MRS Bulletin, Nov. 2004, pp. 829-832.
Hwang, Y. N. et al., "Full Integration and Reliability Evaluation of Phase-change RAM Based on 0.24um-CMOS Technologies," 2003 Symposium on VLSI Technology Digest of Technical Papers, pp. 173-174.
Iwasaki, Hiroko et al., "Completely Erasable Phase Change Optical Disk," Jpn. J. Appl. Phys., Feb. 1992, pp. 461-465, vol. 31.
Jeong, C. W. et al., "Switching Current Scaling and Reliability Evaluation in PRAM," IEEE Non-Volatile Semiconductor Memory Workshop, Monterey, CA 2004, pp. 28-29 and workshop cover sheet.
Kim, Kinam et al., "Reliability Investigations for Manufacturable High Density PRAM," IEEE 43rd Annual International Reliability Physics Symposium, San Jose, 2005, pp. 157-162.
Kojima, Rie et al., "Ge-Sn-Sb-Te Phase-change Recording Material Having High Crystallization Speed," Proceedings of PCOS 2000, pp. 36-41.
Lacita, A. L., "Electrothermal and Phase-change Dynamics in Chalcogenide-based Memories," IEEE IEDM 2004, 4 pp.
Lai, Stefan, "Current Status of the Phase Change Memory and Its Future," IEEE IEDM 2003, pp. 255-258.
Lai, Stephan et al., "OUM-A 180 nm Nonvolatile Memory Cell Element Technology for Stand Alone and Embedded Applications," IEEE IEDM 2001, pp. 803-806.
Lankhorst, Martijn H.R., et al; Low-Cost and Nanoscale Non-Volatile Memory Concept for Future Silicon Chips, Mar. 13, 2005, 6 pp., Nature Materials Advance Online Publication, www.nature.com/naturematerials.
Mott, Nevill, "Electrons in Glass," Nobel Lecture, Dec. 8, 1977, Physics, 1977, pp. 403-413.
Ovonyx Non-Confidential paper entitled "Ovonic Unified Memory," Dec. 1999, pp. 1-80.
Ovshinsky, Sandford R., "Reversible Electrical Switching Phenomena in Disordered Structures," Physical Review Letters, vol. 21, No. 20, Nov. 11, 1968, pp. 1450-1453.
Owen, Alan E. et al., "Electronic Conduction and Switching in Chalcogenide Glasses," IEEE Transactions on Electron Devices, vol. Ed. 20, No. 2, Feb. 1973, pp. 105-122.
Pellizer, F. et al.,"Novel u Trench Phase -Change Memory Cell for Embedded and Stand-Alone Non-Volatile Memory Applications," 2004 Symposium on VLSI Technology Digest of Technical Papers, pp. 18-19.
Pirovano, Agostino et al.,"Reliability Study of Phase-Change Nonvolatile Memories," IEEE Transactions on Device and Materials Reliability, Sep. 2004, pp. 422-427, vol. 4, No. 3.
Prakash, S. et al., "A guideline for Designing Chalcogenide-Based Glasses for Threshold Switching Characteristics," IEEE Electron Device Letters, vol. 18, No. 2, Feb. 1997, pp. 45-47.
Radaelli, A. et al., "Electronic Switching Effect and Phase-Change Transition in Chalcogenide Materials," IEEE Electron Device Letters, Oct. 2004, pp. 684-686, vol. 25, No. 10.

Rochefort, C. et al., "Manufacturing of High Aspect-Ration p-n Junctions Using Vapor Phase Doping for Application in Multi-Resurf Devices," IEEE 2002, pp. 237-240.

Schafft, Harry A. et al., "Thermal Conductivity Measurements of Thin Films Silicon Dioxide," Proceedings of the IEEE 1989 International Conference on Microelectronic Test Structures vol. 2, No. 1, Mar. 1989, pp. 121-124.

Strauss, Karl F. et al., "Overview of Radiation Tolerant Unlimited Write Cycle Non-Volatile Memory," IEEE 2000, pp. 399-408.

Subramanian, Vivek et al., "Low Leakage Germanium-Seeded Laterally-Crystallized Single-Grain 100-nm TFT's for Vertical Integration Applications," IEEE Electron Device Letters, vol. 20, No. 7, Jul. 1999, pp. 341-343.

Wicker, Guy et al., Nonvolatile, High Density, High Performance Phase Change Memory, 1999, http://klabs.org/richcontent/MAPLDCon99/Papers/P21_Tyson_P.PDF#search='nonvolatile%20high%20density%20high%20performance%20phase%20change%20memory', 8pages.

Wicker, Guy, "A Comprehensive Model of Submicron Chalcogenide Switching Devices," Doctoral Dissertation, Wayne State University, Detroit, MI 1996, 137 pp.

Wolf, Stanley, Excerpt from: Silicon Processing for the VLSI Era-vol. 4, pp. 674-679, 2004.

Wuttig, Matthias, "Towards a Universal Memory?" Nature Materials, Apr. 2005, pp. 265-266, vol. 4.

Yamada, Noboru, "Potential of Ge-Sb-Te phase-change optical disks for high-data-rate recording in the near future," (Conference Proceedings Paper), Jul. 30, 1997, vol. 3109, 10 pages.

Yi, J. H. et al., "Novel Cell Structure of PRAM with Thin Metal Layer Inserted GeSbTe," IEEE IEDM 2003, 4 pages.

Yonehara, T. et al., "Control of Grain Boundary Location by Selective Nucleation Over Amorphous Substrates," Mat. Res. Soc. Symp. Proc., vol. 106, 1998, pp. 21-26.

* cited by examiner

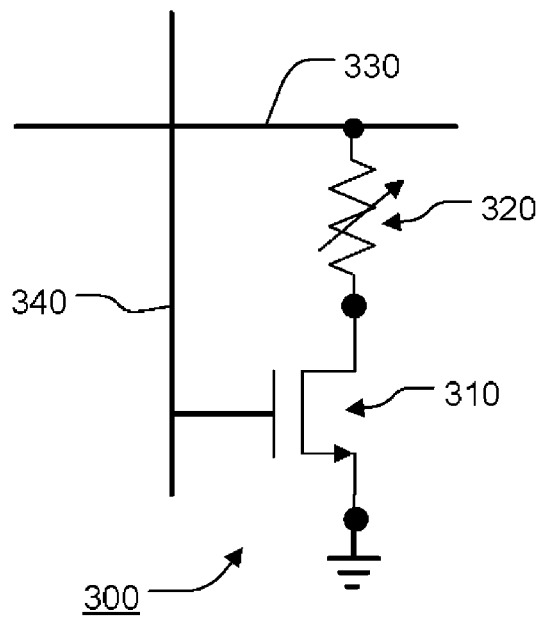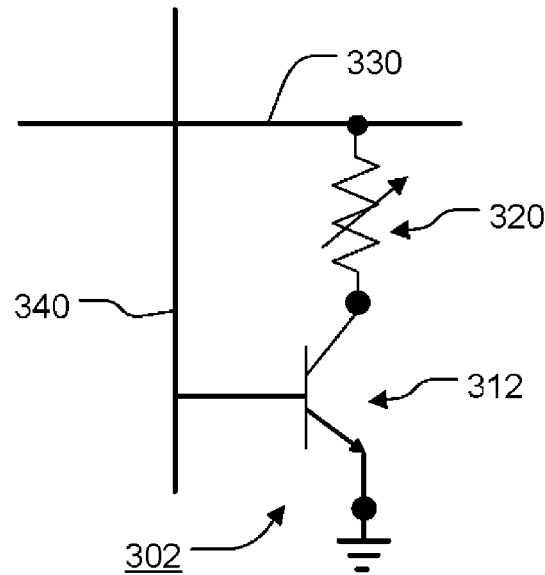
**Fig. 3A
(Prior Art)**
**Fig. 3B
(Prior Art)**
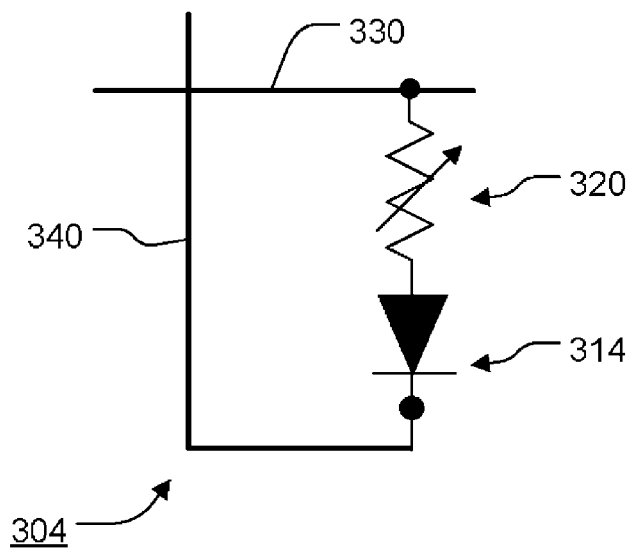
**Fig. 3C
(Prior Art)**

US 8,036,014 B2

PHASE CHANGE MEMORY PROGRAM METHOD WITHOUT OVER-RESET

PARTIES TO A JOINT RESEARCH AGREEMENT

International Business Machines Corporation, a New York corporation, and Macronix International Corporation, Ltd., a Taiwan corporation, are parties to a Joint Research Agreement.

BACKGROUND OF THE INVENTION

1. Field of the Invention

The present invention relates to memory devices based on phase change based memory materials, and to methods for operating such devices.

2. Description of Related Art

Phase change based memory materials, like chalcogenide based materials and similar materials, can be caused to change phase between an amorphous state and a crystalline state by application of electrical current at levels suitable for implementation in integrated circuits. The generally amorphous state is characterized by higher electrical resistivity than the generally crystalline state, which can be readily sensed to indicate data. These properties have generated interest in using programmable resistive material to form nonvolatile memory circuits, which can be read and written with random access.

In phase change memory, data is stored by causing transitions in an active region of the phase change material between amorphous and crystalline states. FIG. 1 is a distribution of the resistance of a number of memory cells comprising a phase change memory element. The memory cells are programmable to a plurality of resistance states including a high resistance reset (erased) state 102 and at least one lower resistance programmed (set) state 100. Each resistance state has a non-overlapping resistance range.

The difference between the highest resistance $R_1$ of the lower resistance state 100 and the lowest resistance $R_2$ of the high resistance reset state 102 defines a read margin 101 used to distinguish cells in the lower resistance state 100 from those in the high resistance state 102. The data stored in a memory cell can be determined by determining whether the memory cell has a resistance corresponding to the lower resistance state 100 or to the high resistance state 102, for example by measuring whether the resistance of the memory cell is above or below a threshold resistance value $R_{SA}$ 103 within the read margin 101.

The change from the high resistance state 102 to the lower resistance state 100, referred to as a set (or program) operation herein, is generally a lower current operation in which current heats the phase change material above a transition temperature to cause transition from the amorphous to the crystalline state. The change from the lower resistance state 100 to the higher resistance state 102, referred to as a reset operation herein, is generally a higher current operation, which includes a short high density pulse to melt or breakdown the crystalline structure, after which the phase change material cools quickly, quenching the phase change process and allowing at least a portion of the phase change material to stabilize in the amorphous state.

In order to reliably distinguish between the high resistance state 102 and the lower resistance state 100, and thus properly determine the data value stored in a memory cell, it is important to maintain a relatively large read margin 101. However, due to variations in materials, manufacturing processes, and the operating environment, the reset current needed to change to the higher resistance state 102 will vary among memory cells in an array. This variation in the reset current is illustrated in the example distribution curve 200 of FIG. 2 which is a distribution in the reset current needed among a number of memory cells.

Previous attempts at addressing this variation in the reset current among memory cells in an array include choosing a single, suitably high reset current $I_{RESET}$ 210 of FIG. 2 capable of resetting each of the memory cells in an array to the higher resistance state 102.

However, using the reset current $I_{RESET}$ 210 for each memory cell in an array results in the memory elements of at least some of the memory cells receiving significantly higher current levels than are necessary to cause a transition to the higher resistance state 102 and is referred to as being "over-reset". Since the phase change material undergoes a phase change as a result of heating, using unnecessarily high current levels can result in electrical and mechanical reliability problems for the memory cell. These problems include the formation of voids at the phase change material/electrode interface due to mechanical stress caused by thermal expansion and material density changes during operation.

Additionally, using significantly higher current levels than necessary can result in problems such as localized heating sufficient to induce diffusion/reaction of electrode and phase change material, and/or cause compositional changes in the phase change material within the active region, resulting in resistive switching performance degradation and possible failure of the memory cell.

It is therefore desirable to provide phase changed based memory devices and methods for operating such devices which provide the current needed to induce a phase change to the high resistance reset state while also avoiding the use of significantly higher levels of current through the phase change material than necessary.

SUMMARY OF THE INVENTION

A method is described herein for operating a memory cell comprising a phase change memory element programmable to a plurality of resistance states including a higher resistance state and a lower resistance state, the phase change memory element having a threshold voltage above which a transition begins from the higher resistance state to the lower resistance state. The method comprises applying a fixed sequence of voltage pulses across the memory cell of increasing pulse height to change the resistance state from the lower resistance state to the higher resistance state. The fixed sequence of voltage pulses cause increasing current through the phase change memory element until change to the higher resistance state occurs. Also, after the change the voltage pulses in the sequence cause a voltage across the phase change memory element less than the threshold voltage.

A memory device as described herein comprises a memory cell comprising a phase change memory element programmable to a plurality of resistance states including a higher resistance state and a lower resistance state, the phase change memory element having a threshold voltage above which a transition begins from the higher resistance state to the lower resistance state. The memory device further comprises bias circuitry adapted to apply a fixed sequence of voltage pulses as described above across the memory cell.

Reset operations described herein provide the current needed to induce a phase change to the higher resistance state for the memory cells of the array while also avoiding the use of unnecessarily high reset currents. Successive voltage pulses in the fixed sequence provide increasing current through the memory element of the memory cell until change to the higher resistance state occurs. Once the memory element is reset to the higher resistance state by a particular voltage pulse in the fixed sequence, the remaining voltage pulses in the fixed sequence are below the threshold voltage and thus insufficient to change the resistance state back from the higher resistance state to the lower resistance state. As a result, the memory cells of an array can be reset with a current near the necessary reset current and avoid over-reset.

Other aspects and advantages of the present invention can be seen on review of the drawings, the detailed description, and the claims which follow.

BRIEF DESCRIPTION OF THE DRAWINGS

FIGS. 3A-3C illustrate schematic diagrams of three prior art phase change memory cells having a phase change memory element and coupled to an access device such as a transistor or diode.

DETAILED DESCRIPTION

Figure 1:
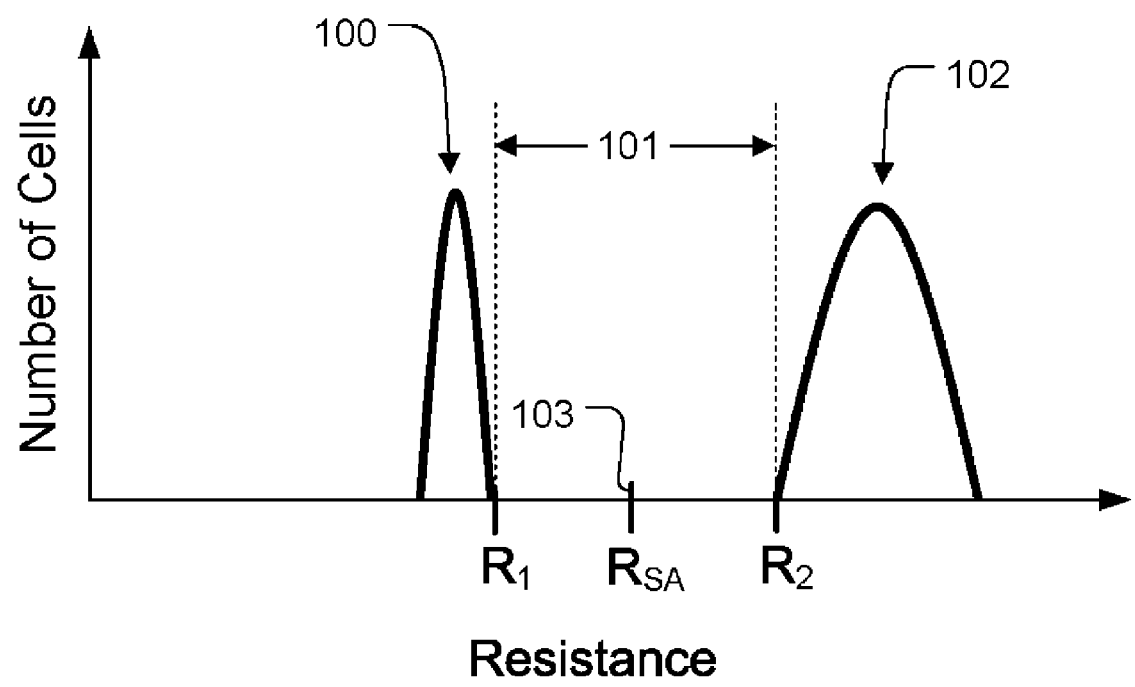
FIG. 1 is a distribution of the resistance of a number of memory cells comprising a phase change memory element.
Figure 2:
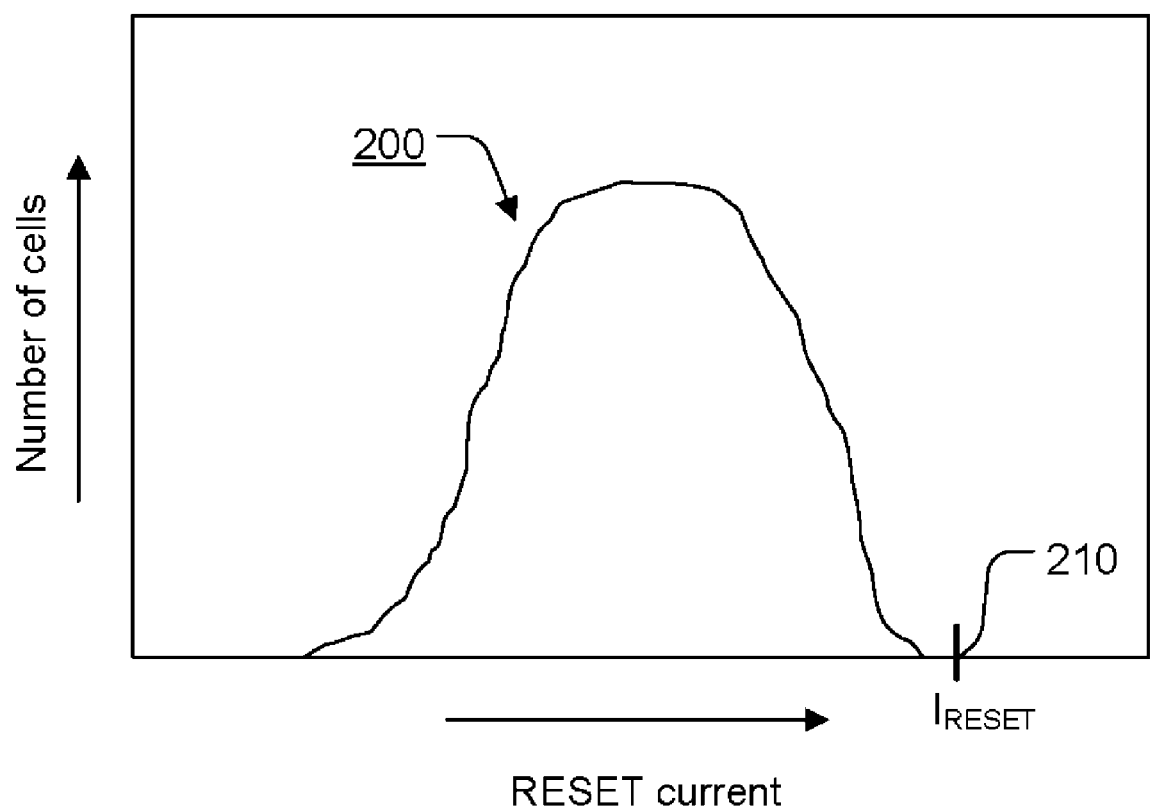
FIG. 2 which is a distribution in the reset current needed among a number of memory cells.

The following description of the disclosure will typically be with reference to specific structural embodiments and methods. It is to be understood that there is no intention to limit the disclosure to the specifically disclosed embodiments and methods, but that the disclosure may be practiced using other features, elements, methods and embodiments. Preferred embodiments are described to illustrate the present disclosure, not to limit its scope, which is defined by the claims. Those of ordinary skill in the art will recognize a variety of equivalent variations on the description that follows. Like elements in various embodiments are commonly referred to with like reference numerals.

FIGS. 3A-3C illustrate schematic diagrams of three prior art phase change memory cells having a phase change memory element 320 (represented in the Figures by a variable resistor) and coupled to an access device such as a transistor or diode.

FIG. 3A illustrates a schematic diagram of a prior art memory cell 300 including a field effect transistor (FET) 310 as an access device. A word line 340 extending in a first direction is coupled to the gate of the FET 310 and a memory element 320 couples the drain of the FET 310 to a bit line 330 extending in a second direction.

FIG. 3B illustrates a schematic diagram of memory cell 302 similar to that of FIG. 3A except that the access device is implemented as a bipolar junction transistor (BJT) 312, while FIG. 3C illustrates a schematic diagram of a memory cell 304 similar to that of FIG. 3A except that the access device is implemented as a diode 314.

Reading or writing can be achieved by applying suitable voltages to the word line 340 and bit line 330 to induce a current through the memory element 320. The level and duration of the voltages applied is dependent upon the operation performed, e.g. a reading operation or a writing operation.

FIGS. 4A-4E illustrate cross-sectional views of prior art configurations for memory element 320.

Figure 4A:
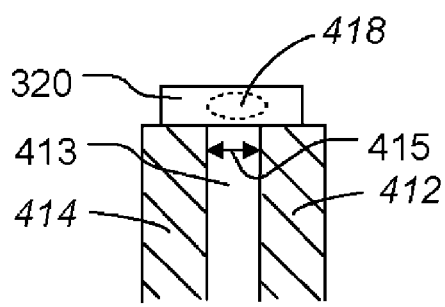
FIGS. 4A-4E illustrate cross-sectional views of prior art configurations for the memory element.

FIG. 4A is a simplified cross-sectional view illustrating a first configuration for memory element 320 coupled to first and second electrodes 412, 414. The first electrode 412 may, for example, be coupled to a terminal of an access device such as a diode or transistor, while the second electrode 414 may be coupled to a bit line.

A dielectric spacer 413 having a width 415 separates the first and second electrodes 412, 414. The phase change material of memory element 320 extends across the dielectric spacer 413 and contacts the first and second electrodes 412, 414, thereby defining an inter-electrode path between the first and second electrodes 412, 414 having a path length defined by the width 415 of the dielectric spacer 413. In operation, as current passes between the first and second electrodes 412, 414 and through the memory element 320, the active region 418 of the phase change material of the memory element 320 heats up more quickly than the remainder of the memory element 320.

Figure 4B:
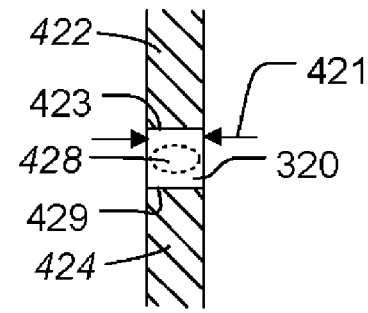

FIG. 4B is a simplified cross-sectional view illustrating a second configuration for memory element 320 coupled to first and second electrodes 422, 424. The phase change material of the memory element 320 has an active region 428 and contacts the first and second electrodes 422, 424 at top and bottom surfaces 423, 429 respectively. The memory element 320 has a width 421 the same as that of the first and second electrodes 422, 424.

Figure 4C:
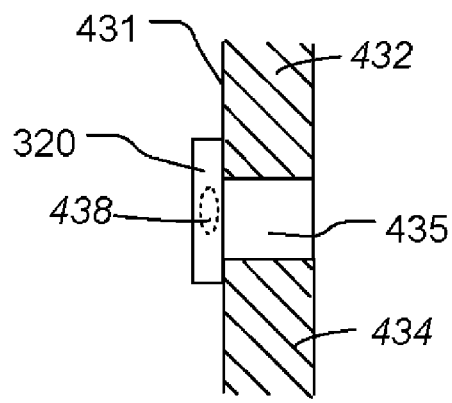

FIG. 4C is a simplified cross-sectional view illustrating a third configuration for memory element 320 coupled to first and second electrodes 432, 434, the phase change material of memory element 320 having an active region 438. The first and second electrodes 432, 434 are separated by dielectric spacer 435. The first and second electrodes 432, 434 and the dielectric spacer 435 have a sidewall surface 431. The phase change material of memory element 320 is on the sidewall surface 431 and extends across the dielectric spacer 435 to contact the first and second electrodes 432, 434.

Figure 4D:
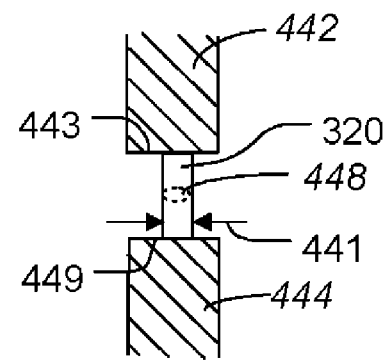

FIG. 4D is a simplified cross-sectional view illustrating a fourth configuration for memory element 320 coupled to first and second electrodes 442, 444. The phase change material of memory element 320 has an active region 448 and contacts the first and second electrodes 442, 444 at top and bottom surfaces 443, 449 respectively. The memory element 320 has a width 441 less than that of the first and second electrodes 442, 444.

Figure 4E:
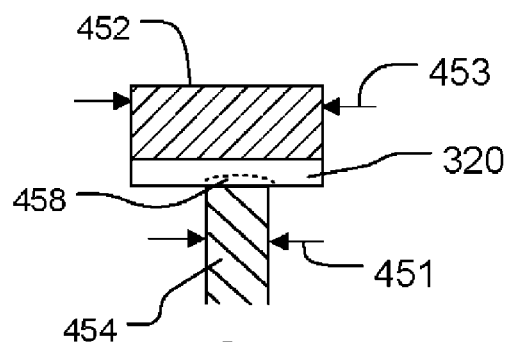

FIG. 4E is a simplified cross-sectional view illustrating a fifth configuration for memory element 320 coupled to first and second electrodes 354, 352. The first electrode 454 has a width 451 less than width 453 of the second electrode 452 and memory element 320. Because of the difference between width 451 and width 453, in operation the current density in the phase change material of memory element 320 is largest in the region adjacent the first electrode 454, resulting in the active region 458 having a "mushroom" shape as shown in the Figure.

Figure 5:
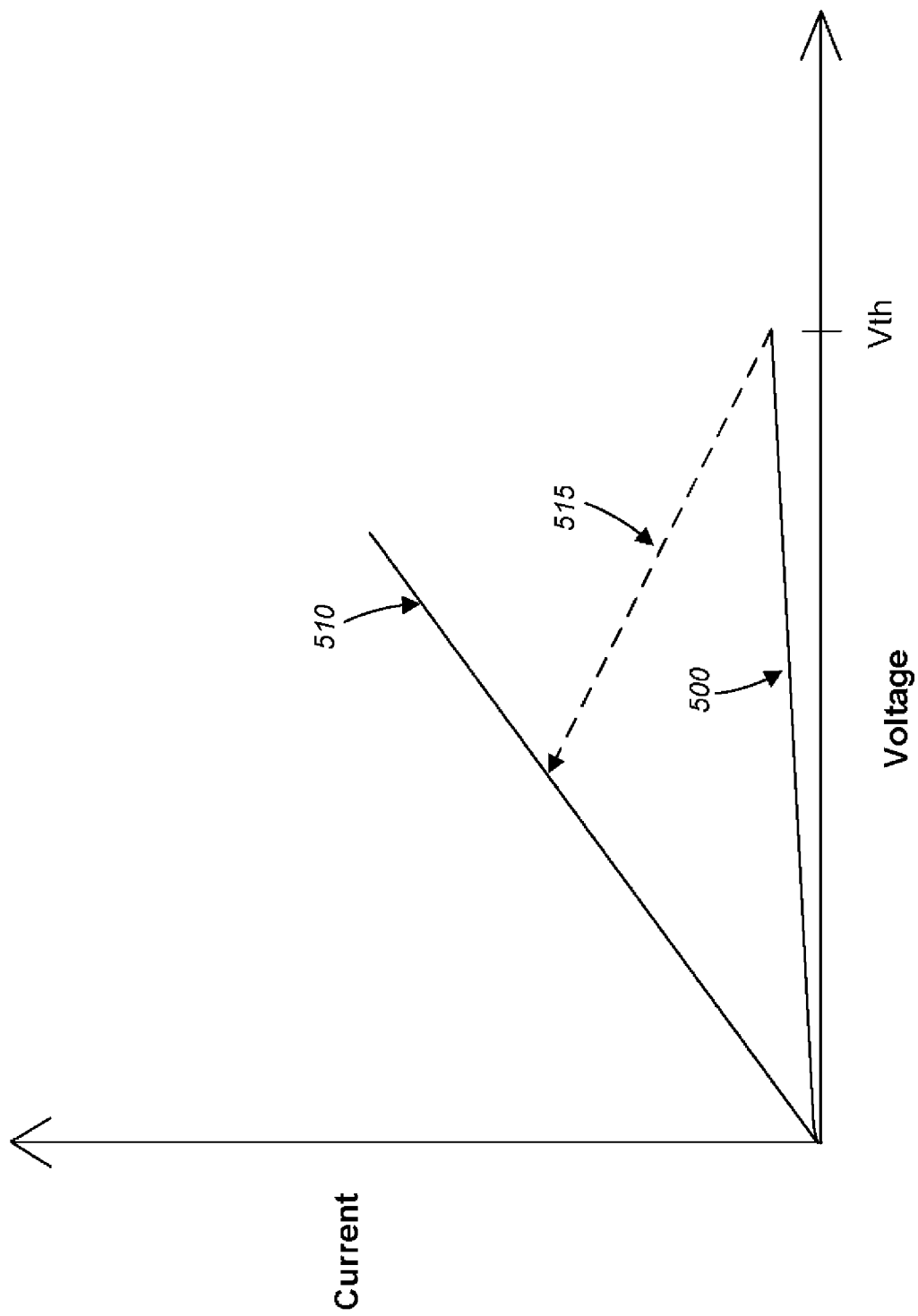
FIG. 5 illustrates a simplified current-voltage (IV) curve for the phase change memory element.

FIG. 5 illustrates example current-voltage (IV) behavior for a phase change memory element 320. In FIG. 5, line 500 represents the behavior of the memory element 320 in the high resistance reset state. Line 510 represents the behavior of the memory cell 320 in the low resistance set state. As will be understood the lines 500 and 510 are simplified and not necessarily to scale.

FIG. 5 also includes line 515 representing the transition from the high resistance reset state 500 to the low resistance set state 510. The line 515 begins at a threshold voltage $V_{th}$, when the cell is in the high resistance reset state 500. The threshold voltage $V_{th}$ is a voltage level across the memory element 320 above which a transition begins from the higher resistance state to the lower resistance state. As can be seen in FIG. 5 the threshold voltage $V_{th}$ is where the phase change material moves from the stable amorphous phase to where current increases but voltage decreases.

Because the memory cell undergoes a phase change as a result of heating of the phase change material of the memory element 320, it will be understood that the threshold voltage $V_{th}$ is dependent upon the implementation of the memory cell including the memory cell structure, the thermal and electrical properties of the materials of the memory cell including the phase change material, and the pulse shape of the applied energy. The threshold voltage $V_{th}$ can be determined empirically for each embodiment.

Figure 6:
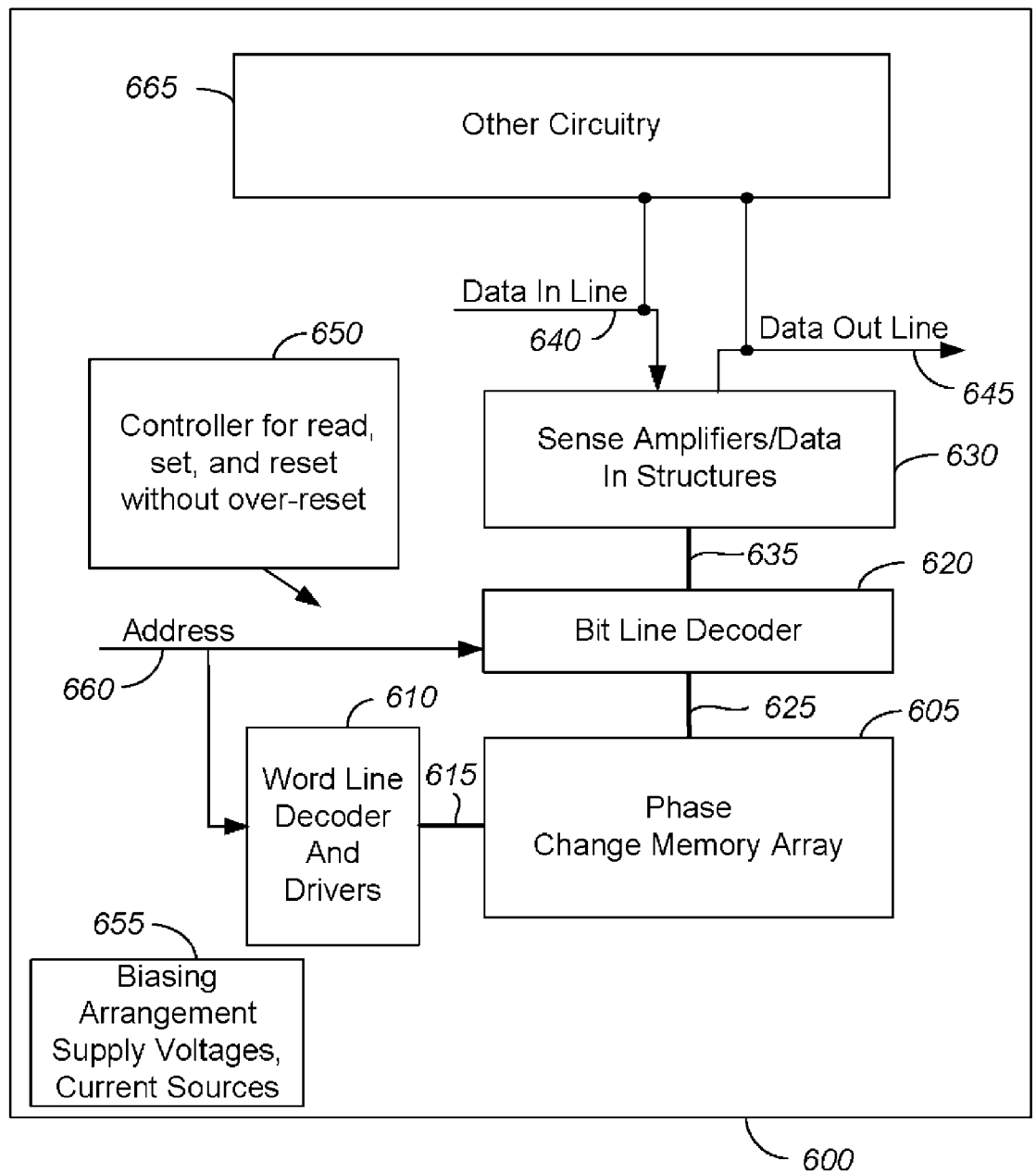
FIG. 6 is a simplified block diagram of an integrated circuit in which the reset operations described herein can be implemented.

FIG. 6 is a simplified block diagram of an integrated circuit 600 in which the reset operations (described in more detail below) can be implemented, the reset operations providing the current needed to induce a phase change to the high resistance reset state while also avoiding the use of unnecessarily high reset current and resulting in improved reliability and improved data storage performance of the integrated circuit 600. The integrated circuit 600 includes a memory array 605 implemented using phase change memory cells (not shown). A word line decoder and drivers 610 having read, set, and reset without over-reset modes is coupled to and in electrical communication with a plurality of word lines 615 arranged along rows in the memory array 605. A bit line (column) decoder 620 is in electrical communication with a plurality of bit lines 625 arranged along columns in the array 605 for reading, setting, and resetting without over-resetting of the phase change memory cells in array 605. Addresses are supplied on bus 660 to word line decoder and drivers 610 and bit line decoder 620. Sense circuitry (Sense amplifiers) and data-in structures in block 630 are coupled to bit line decoder 620 via data bus 635. Data is supplied via a data-in line 640 from input/output ports on integrated circuit 600, or from other data sources internal or external to integrated circuit 600, to data-in structures in block 630. Other circuitry 665 may be included on integrated circuit 600, such as a general purpose processor or special purpose application circuitry, or a combination of modules providing system-on-a-chip functionality supported by array 605. Data is supplied via a data-out line 645 from the sense amplifiers in block 630 to input/output ports on integrated circuit 600, or to other data destinations internal or external to integrated circuit 600.

The integrated circuit 600 includes a controller 650 for read, set, and reset without over-reset modes. The controller 650, implemented in this example using a bias arrangement state machine, controls the application of bias arrangement supply voltages and current sources 655 for the application of bias arrangements including read, set, and reset without over-reset comprising applying voltage pulses of increasing pulse height across a selected memory cell (discussed in more detail below) or across a group of selected memory cells (also discussed in more detail below). The controller 650 is coupled to the sense amplifiers in block 630 via feedback bus 675, the controller 650 controlling the bias arrangement supply voltages and current sources 655. Controller 650 may be implemented using special-purpose logic circuitry as known in the art. In alternative embodiments, controller 650 comprises a general-purpose processor, which may be implemented on the same integrated circuit to execute a computer program to control the operations of the device. In yet other embodiments, a combination of special-purpose logic circuitry and a general-purpose processor may be utilized from implementation of controller 650.

Figure 7:
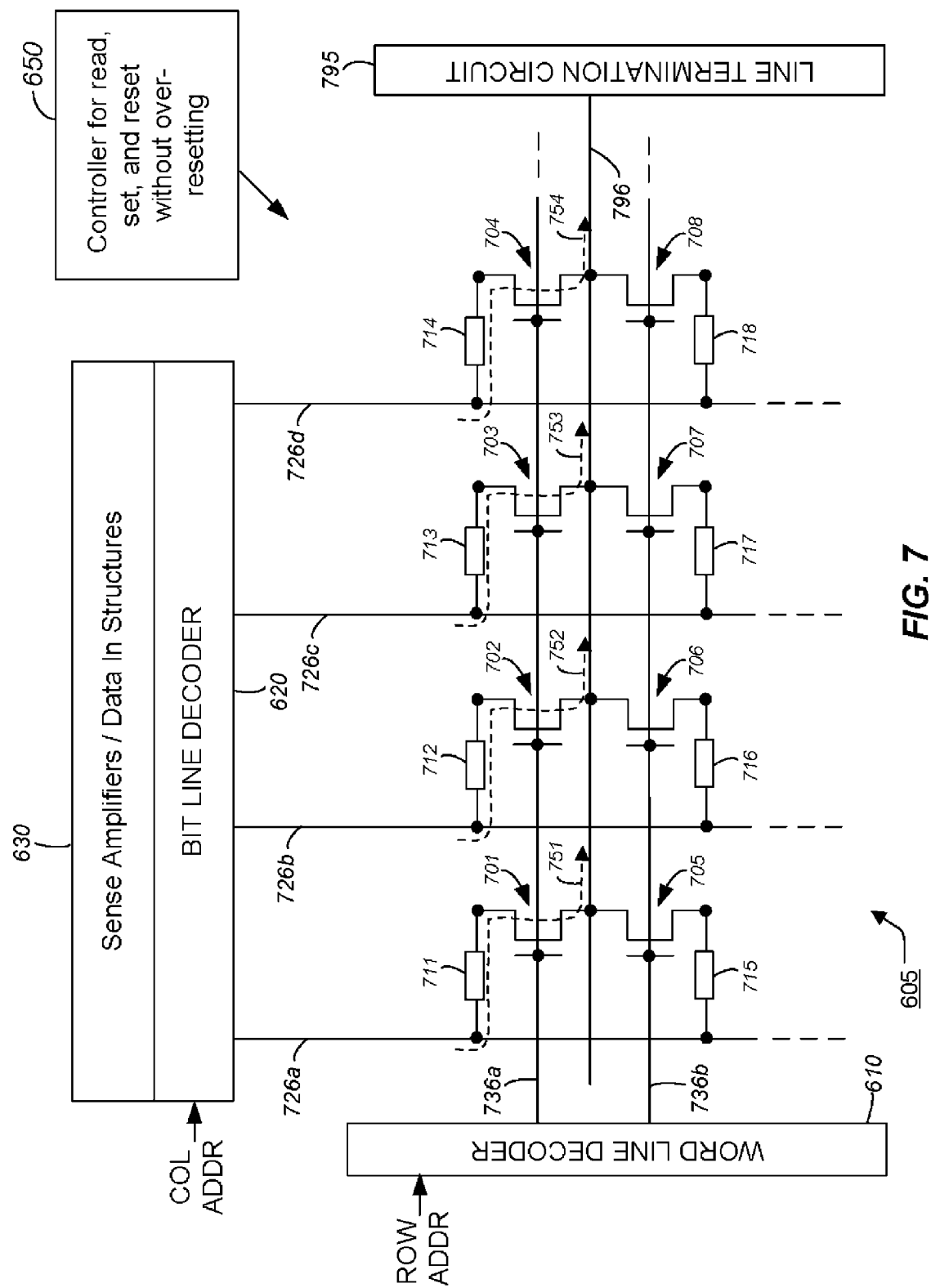
FIG. 7 illustrates a first embodiment for the array of the integrated circuit.

FIG. 7 illustrates a first embodiment for array 605 of the integrated circuit 600. As shown in the embodiment of FIG. 7, each of the memory cells of array 605 includes an field effect transistor access device, eight of which are shown as memory cells 701-708 having respective phase change memory elements 711-718 are illustrated in FIG. 7, representing a small section of an array that can include millions of memory cells. The memory elements are programmable to a plurality of resistance states including a high resistance state and at least one lower resistance state.

Sources of each of the access transistors of memory cells 711-718 are connected to common line 796 that terminates in a line termination circuit 795, such as a ground terminal. In another embodiment the sources of the access devices are not electrically connected, but independently controllable. The line termination circuit 795 may include bias circuits such as voltage sources and current sources, and decoding circuits for applying bias arrangements, other than ground, to the common line 796 in some embodiments.

A plurality of word lines including word lines 736a, 736b extend in parallel along a first direction. Word lines 736a, 736b are in electrical communication with word line decoder 610. The gates of access transistors of memory cells 701-704 are connected to word line 736a, and the gates of access transistors of memory cells 705-718 are connected to word line 736b.

A plurality of bit lines 625 including bit lines 726a, 726b, 726c, 726d extend in parallel in a second direction and are in electrical communication with bit line decoder 620. Memory elements 711, 715 couple the bit line 726a to the respective drain terminals of the access transistors of memory cells 701, 705. Memory elements 712, 716 couple the bit line 726b to the respective drain terminals of the access transistors of memory cells 702, 706. Memory elements 713, 717 couple the bit line 726c to the respective drain terminals of the access transistors of memory cells 703, 707. Memory elements 714, 718 couple the bit line 726d to the respective drain terminals of the access transistors of memory cells 703, 707.

It will be understood that the memory array 605 is not limited to the array configuration illustrated in FIG. 7, and other array configurations can alternatively be used.

Referring back to FIG. 7, in operation each of the memory cells 701-718 store a data value depending upon the resistance of the corresponding memory elements 711-718. The data value may be determined, for example, by comparison of current on a bit line for a selected memory cell to that of a suitable reference current. In a memory cell having three or more states, a plurality of reference currents can be established so that differing ranges of bit line currents correspond to each of the three or more states.

Reading or writing to a memory cell of array 605, therefore, can achieved by applying a suitable voltage to a word line 736 and coupling a bit line 726 to a voltage so that current flows through the selected memory cell including through the corresponding memory element. For example, a current path 751 through a selected memory cell (in this example memory cell 701 and corresponding memory element 711 are selected) is established by applying voltages to the bit line 726a, word line 736a, and common line 796 sufficient to turn on the access transistor of memory cell 701 and induce current in path 701 to flow from the bit line 726a to the common line 796, or vice-versa. Similarly, current paths 752, 753, 754 can be established through memory cells 702, 703, 704 respectively. The level and duration of the voltages applied is dependent upon the operation performed, e.g. a reading operation or a writing operation.

In a read (or sense) operation of memory cell 701, word line decoder 610 is responsive to ROW ADDR to facilitate providing word line 736a with a suitable voltage to turn on the access transistor of the memory cell 701. Bit line decoder 620 is responsive to COL ADDR to facilitate supplying a voltage to bit line 726a of suitable amplitude and duration to induce current to flow that does not result in the memory element 711 undergoing a change in resistive state. The current on the bit line 726a and through the memory element 711 is dependent upon the resistance of, and therefore the data state associated with, the memory element 711 of the memory cell 701. Thus, the data state of the memory cell may be determined, for example by comparison of the current on bit line 726a with a suitable reference current by sense amplifiers of sense circuitry 630.

In a set (or program) operation of memory cell 701, word line decoder 610 facilitates providing word line 736a with a suitable voltage pulse to turn on the access transistor of the memory cell 701. Bit line decoder 620 facilitates supplying a voltage to bit line 726a of suitable amplitude and duration to induce a current to flow through the memory element 711, the current sufficient to raise the temperature of at least a portion of an active region above the transition temperature of the phase change material and cause a transition of at least a portion of the active region from the amorphous phase to a crystalline phase, this transition lowering the resistance of the memory element 711 and setting the memory cell 701 to the desired state.

Figure 8:
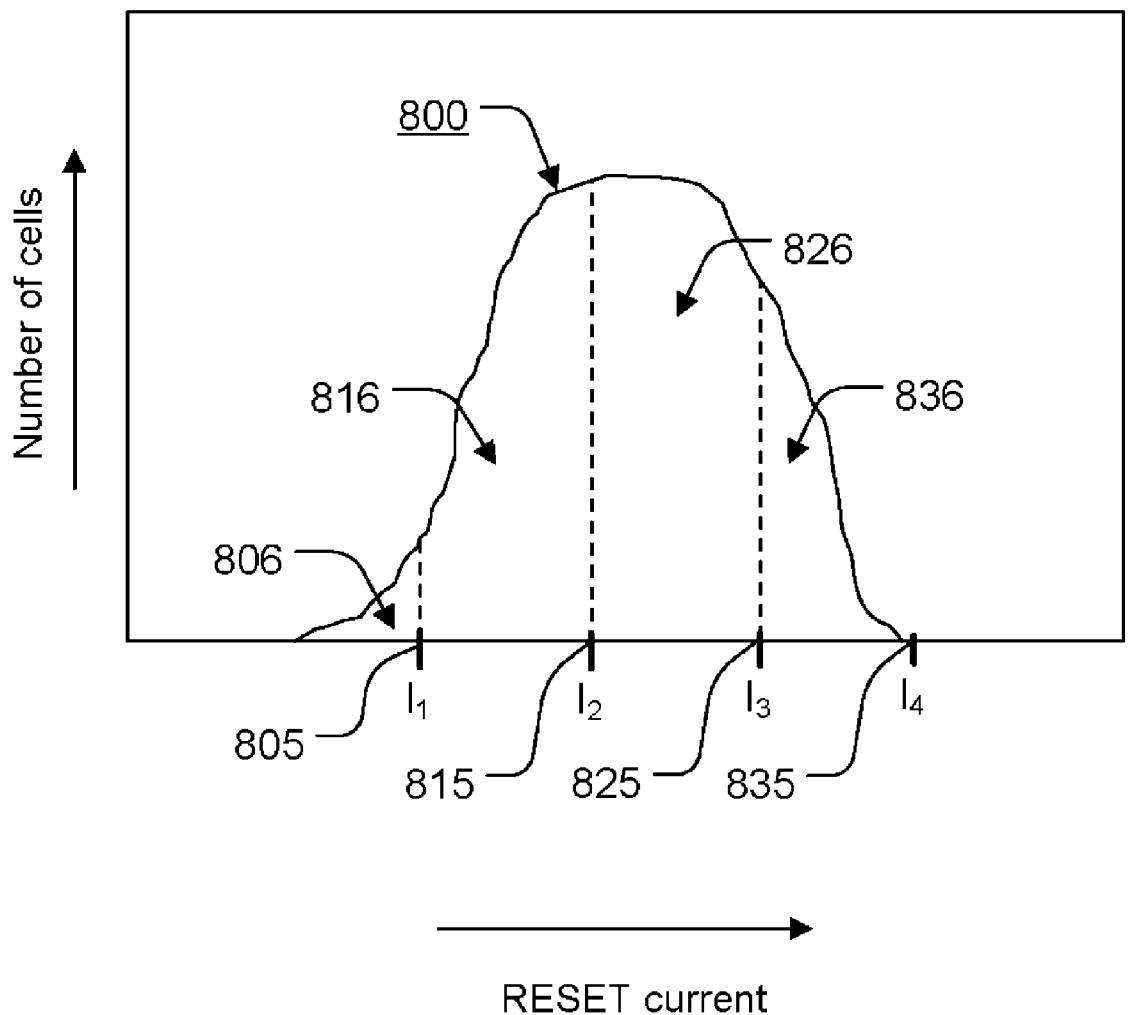
FIG. 8 illustrates an example distribution of the reset current needed among the memory cells in the array.

Due to variations in materials, manufacturing processes, and the operating environment, the reset current needed to change to the higher resistance reset state will vary among memory cells in the array 605. FIG. 8 illustrates an example distribution 800 of the reset current needed for the memory cells in the array 605.

As was described above, "over-resetting" by using significantly higher reset current levels than are necessary to cause a change to the higher resistance reset state can result in electrical and mechanical reliability problems including resistive switching performance degradation and possible failure of the memory cells of the array 605.

Figure 9:
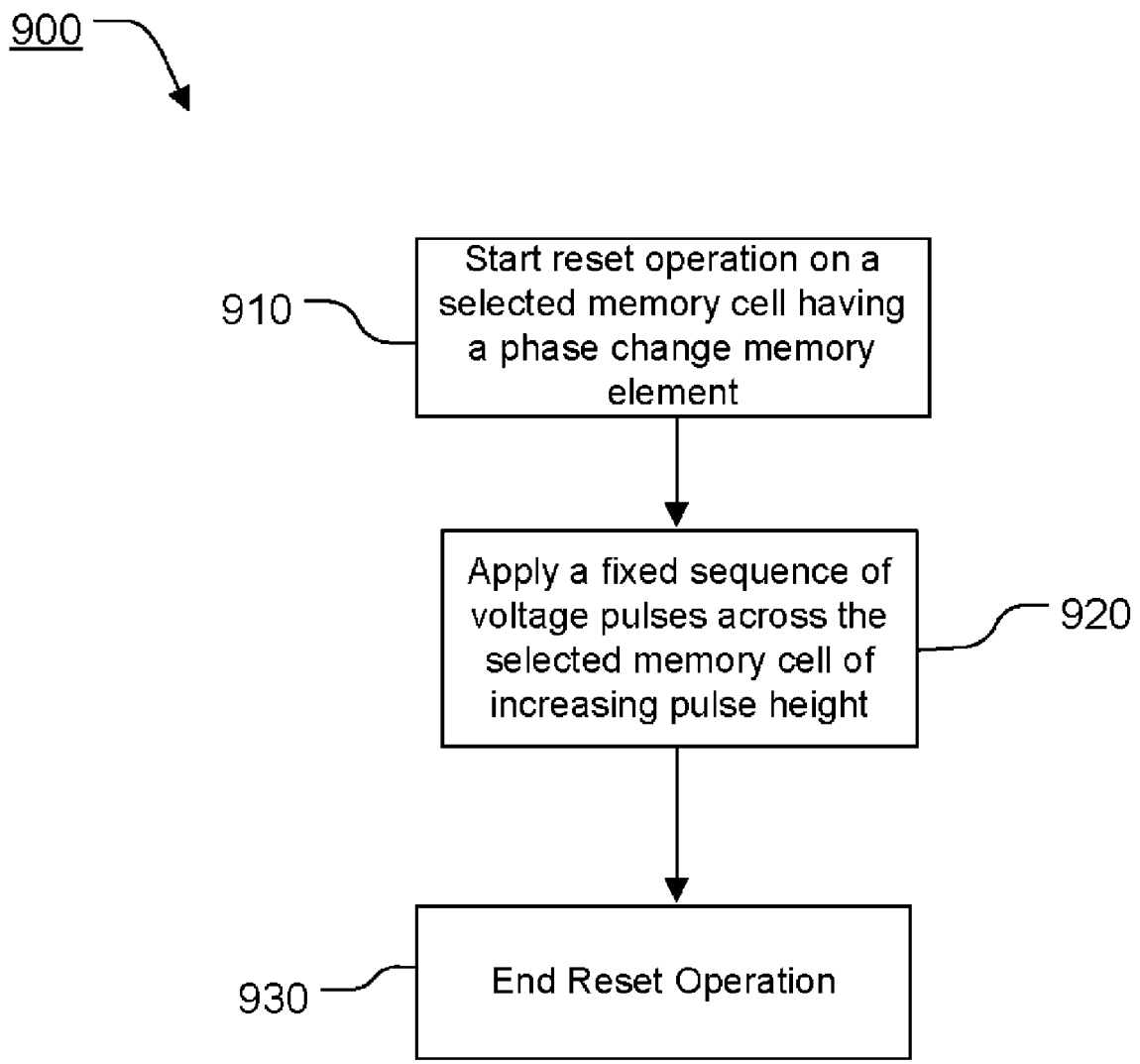
FIG. 9 is a flow diagram of a reset operation of the memory cells of the array.
Figure 10:
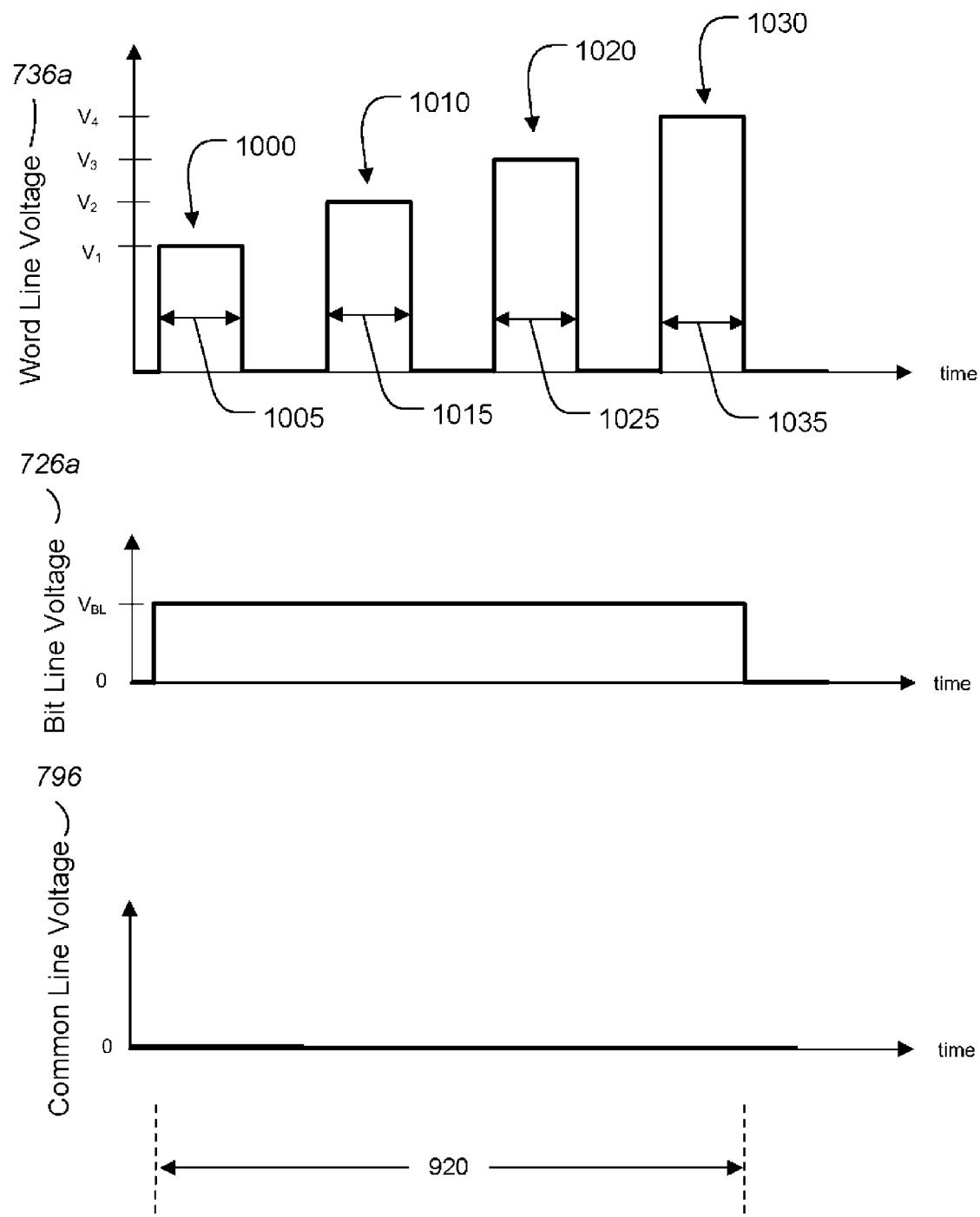
FIG. 10 illustrates a first embodiment of a timing diagram of the reset operation of FIG. 9.

FIG. 9 is a flow diagram of a reset operation 900 of the memory cells of the array 605, the reset operation 900 providing the current needed to induce a phase change to the high resistance reset state for each memory cell in the array 605 while also avoiding the use of unnecessarily high reset currents. Thus, the reset operation 900 can avoid the "over-reset" issues discussed above and result in improved reliability and improved data storage performance for the array 605. FIG. 10 illustrates a first embodiment of a timing diagram of the reset operation 900 of FIG. 9.

The reset operation 900 of a selected memory cell (in this example memory cell 701 having corresponding memory element 711) in the array 605 begins at step 910. Although the discussion below refers to resetting memory cell 701, the fixed sequence of voltage pulses of the reset operation 900 are used for each memory cell in the array 605. Step 910 may include, or in some embodiments be preceded by, a read operation to determine if the selected memory cell needs to be reset by the reset operation 910.

Next, at block 920 a fixed sequence of voltage pulses are applied across the selected memory cell 701 of increasing pulse height to change the resistance state of the memory element 711 from the lower resistance state to the higher reset resistance state. As used herein, the term "fixed sequence of voltage pulses" refers to two or more voltage pulses applied without any intervening read or set operations being performed. For example, no read operation is performed between applying successive voltage pulses in the fixed sequence of voltage pulses.

In the illustrated embodiment of FIG. 10, the fixed sequence of voltage pulses consists of four voltage pulses 1000, 1010, 1020, 1030. However, it will be understood that the present invention is not limited as such and more generally a fixed sequence of two or more voltage pulses may be used.

Successive voltage pulses in the fixed sequence provide increasing current through the memory element 711 until change to the higher resistance reset state occurs. The timing between successive voltage pulses in the fixed sequence is sufficient to allow the phase change material to allow for the quenching of the phase change process.

Additionally, the voltage pulses in the fixed sequence are adapted to cause a voltage across the memory element 711 after the memory element 711 is in the higher resistance state that is less than the threshold voltage $V_{TH}$. Thus, once the memory element 711 is reset to the higher resistance state by a particular voltage pulse, the remaining voltage pulses of the fixed sequence are insufficient to change the resistance state from the higher resistance state. The pulse heights and pulse widths of the various voltage pulses of the fixed sequence of voltage pulses can be determined empirically for each embodiment.

The four voltage pulses 1000, 1010, 1020, 1030 have increasing pulse heights starting from an initial pulse height $V_1$ to a final pulse height $V_4$, and the common line 796 coupled to the source terminal is supplied a ground potential. The fixed sequence of voltage pulses cause an increasing gate-to-source voltage across the access transistor of the memory cell 701 for each subsequent pulse, and thus cause increasing current through the memory element 711 until change to the higher resistance reset state occurs.

In FIG. 10 the bit line 726a is supplied and maintained at a constant voltage $V_{BL}$ during the fixed sequence of voltage pulses. The voltage $V_{BL}$ is high enough to allow for sufficient current to reset the memory element 711, and is low enough that the resultant voltage across the memory element 711 caused by the fixed sequence of voltage pulses is less than the threshold voltage after the memory element 711 has been reset.

Each voltage pulse 1000, 1010, 1020, 1030 in the fixed sequence cause a current sufficient to reset a corresponding group of memory cells which require increasing amounts of reset current, beginning with the lowest group 806 of FIG. 8 requiring the smallest amount of reset current and ending with the highest group 836 requiring the largest amount of reset current. As a result, the reset operation 900 of each memory cell in the array can be reset with a current close to the necessary reset current, thereby avoiding the use of unnecessarily high current levels.

The first voltage pulse 1000 in the fixed sequence applied to the word line 736a has a pulse height $V_1$ and a pulse width 1005, and is adapted to reset a first group of memory cells 806 of FIG. 8 which require a lowest reset current of $I_1$ 805 or less.

The second voltage pulse 1010 in the fixed sequence applied to the word line 736a has a pulse height $V_2$ and a pulse width 1015, and is sufficient to reset memory cells which require a reset current of $I_2$ 815 or less. However, if the memory cell 701 is in the first group 806, the memory element 711 will have already been reset to the higher resistance reset state by the first voltage pulse 1000. In such a case, in response to the second voltage pulse the increased resistance of the memory element 711 results in a relatively small current through the memory element 711. The second voltage pulse 1010 is adapted to also cause a voltage across the memory element 711 less than the threshold voltage $V_{TH}$ if the memory element 711 is already in the higher resistance reset state. Therefore, the second voltage pulse is adapted to reset a second group of memory cells 816 of FIG. 8 which require a reset current between $I_2$ 815 and $I_1$ 805.

The third voltage pulse 1020 in the fixed sequence applied to the word line 736a has a pulse height $V_3$ and a pulse width 1025, and is sufficient to reset memory cells which require a reset current of $I_3$ 825 or less. However, if the memory cell 701 is in the first or second groups 806 and 816, the memory element 711 will have already been reset to the higher resistance reset state by either the first voltage pulse 1000 or the second voltage pulse. In such a case, in response to the third voltage pulse 1020 the increased resistance of the memory element 711 results in a relatively small current through the memory element 711. The third voltage pulse 1020 is adapted to also cause a voltage across the memory element 711 less than the threshold voltage $V_{TH}$ if the memory element 711 is already in the higher resistance reset state. Therefore, the third voltage pulse is adapted to reset a second group of memory cells 816 of FIG. 8 which require a reset current between $I_3$ 825 and $I_2$ 815.

The fourth and final voltage pulse 1030 in the fixed sequence applied to the word line 736a has a pulse height $V_4$ and a pulse width 1035, and is sufficient to reset memory cells all of the memory cells in the array 605. However, if the memory cell 701 is in the first, second or third groups 806, 816, 826 the memory element 711 will have already been reset to the higher resistance reset state by either the first voltage pulse 1000, the second voltage pulse 1010, or the third voltage pulse 1020. In such a case, in response to the fourth voltage pulse 1020 the increased resistance of the memory element 711 results in a relatively small current through the memory element 711. The fourth voltage pulse 1030 is adapted to also cause a voltage across the memory element 711 less than the threshold voltage $V_{TH}$ if the memory element 711 is already in the higher resistance reset state. Therefore, the fourth voltage pulse is adapted to reset the fourth group of memory cells 836 of FIG. 8 which require a reset current between $I_4$ 835 and $I_3$ 825.

Figure 11:
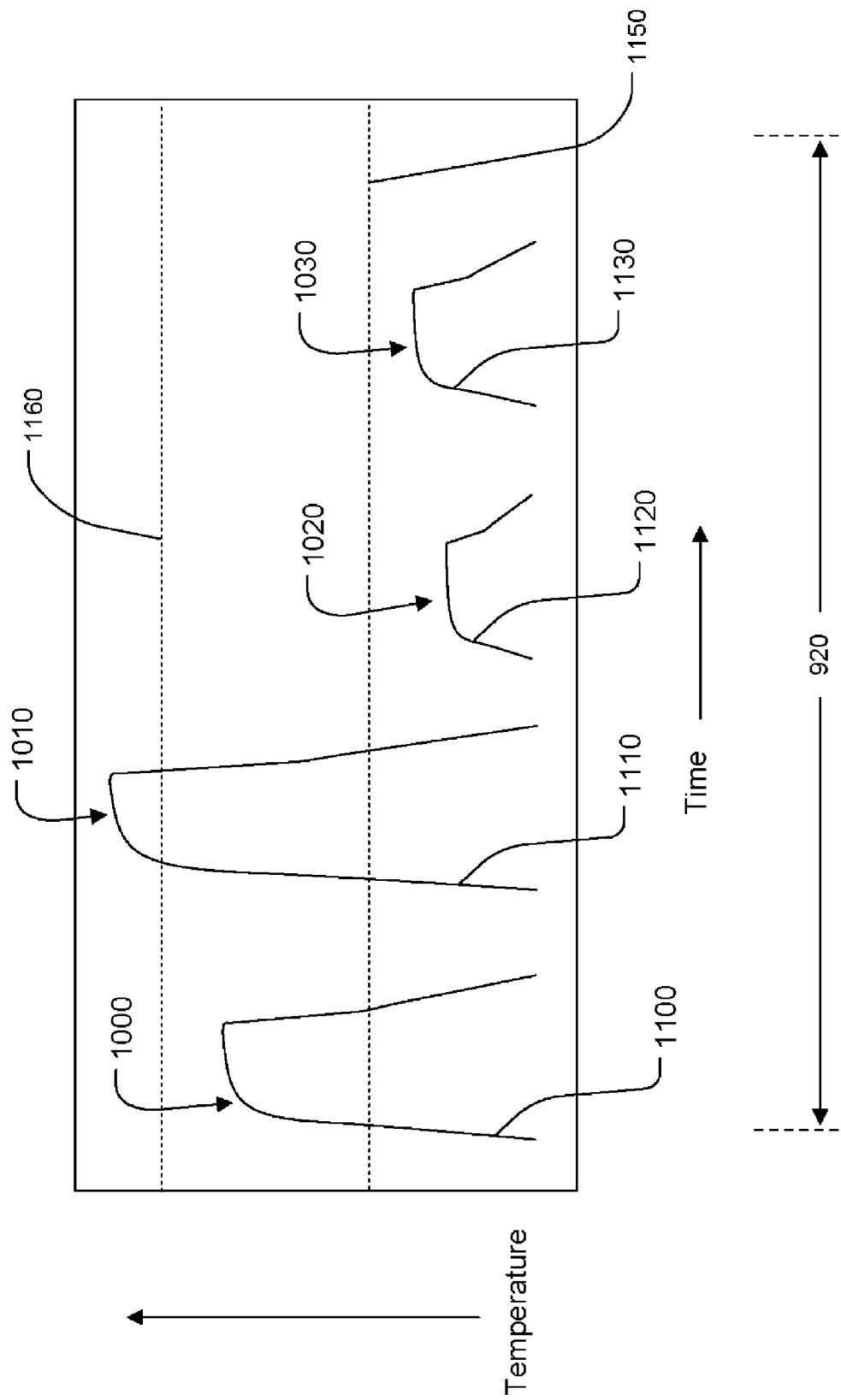
FIG. 11 illustrates plots of the temperature versus time of a memory element during the reset operation of FIGS. 9-10.

FIG. 11 illustrates heuristic plots of the temperature versus time of the memory element 701 to further aid in understanding of the reset operation 900. In this example, the memory cell 701 is in the second group 816 and is thus reset by the second voltage pulse 1020 in the fixed sequence.

As represented heuristically by curve 1100 of FIG. 11, the first voltage pulse 1000 causes current along path 751 and through the memory element 711 sufficient to raise the temperature of at least an active region of the memory element 711 above the transition temperature (crystallization) temperature 1150 of the phase change material. However, the current through the memory element 711 caused by the first voltage pulse 1000 is insufficient to raise the temperature of at least the active region above the melting temperature 1160. Thus, the memory cell 701 needs a reset current greater than $I_1$ 805 and the first voltage pulse 1000 is insufficient to reset the memory element 711.

As represented heuristically by curve 1110 of FIG. 11, the second voltage pulse 1010 induces a current through the memory element 711 sufficient to raise the temperature of at least an active region of the memory element 711 above the transition temperature 1150 and also above the melting temperature 1160 to place at least the active region in a liquid state. The current though the memory element 711 is then quickly terminated by the falling edge of the second pulse 1010, resulting in a transition of the active region into the amorphous phase and establishing the higher resistance reset state in the memory element 711. Thus, in the illustrated example the second voltage pulse 1010 is sufficient to reset the memory element 711.

Since in this example the memory element 711 has already been reset to the higher resistance state by the second voltage pulse 1010, the increased resistance of the memory element 711 results in a relatively small current through the memory element 711 in response to the third voltage pulse 1020. Thus, as represented heuristically by curve 1120 of FIG. 11, the third voltage pulse 1020 induces a current through the memory element 711 insufficient to raise the temperature above the transition temperature 1150, and the memory element 711 remains in the higher resistance reset state.

Similar to the discussion above of the third voltage pulse 1020, because the memory element 711 is in the higher resistance reset state, the increased resistance of the memory element 711 results in a relatively small current through the memory element 711 in response to the fourth voltage pulse 1030. Thus, as represented heuristically by curve 1130 of FIG. 11, the fourth voltage pulse 1030 induces a current through the memory element 711 insufficient to raise the temperature above the transition temperature 1150, and the memory element 711 remains in the higher resistance reset state. The reset operation 900 ends at step 930.

As will be understood, each of the curves of FIG. 11 are merely illustrative and the actual shape of the curves including the resultant temperature depends upon the properties of the memory cell, the manner in which the pulses are applied to the memory cell, and the manner in which the phase change material heats up and cools down. For example, In the illustrated embodiment of FIGS. 9-11, the fixed sequence of voltage pulses consists of four voltage pulses and thus the distribution of reset currents is divided into four corresponding groups. In some alternative embodiments the fixed sequence of voltage pulses may comprise more than four voltage pulses, which further reduces the difference between the required and the actual reset current used for each memory cell in the array. Thus, more generally the fixed sequence of voltage pulses can comprise N (N being a number greater than 1) voltage pulses of increasing pulse height and thus the distribution of reset currents would be divided into N corresponding groups. For example, in some embodiments the fixed sequence of voltage pulses may consist of 8 or 16 pulses. The number of voltage pulses used in the fixed sequence is a tradeoff between the speed of the reset operation and the granularity of over-reset control.

Figure 12:
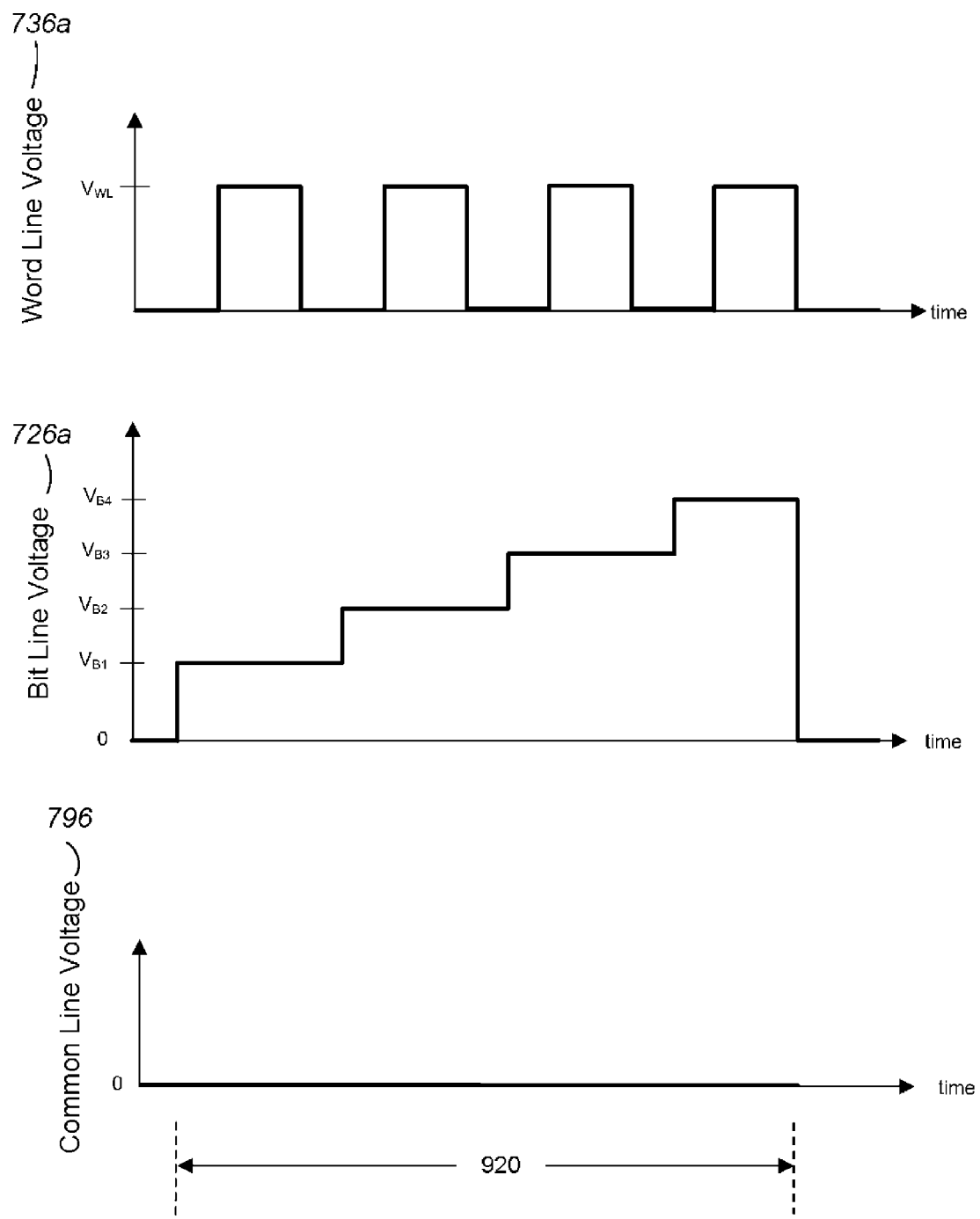
FIG. 12 illustrates a second embodiment of a timing diagram of the reset operation of FIG. 9.

In the timing diagram of FIG. 10 the voltage pulses of increasing pulse height were applied between the word line 736a and the common line 796. FIG. 12 illustrates a second embodiment of a timing diagram of the reset operation 900 of FIG. 9 in which the voltage pulses of increasing pulse height are applied between the bit line 726a and the common line 796.

In FIG. 12, a series of four control voltage pulses having substantially the same pulse height $V_{WL}$ sufficient to turn on the access transistor are applied to the word line 736a, and the common line 796 coupled to the source terminal is supplied a ground potential.

As can be seen in FIG. 12, the voltage on the bit line 726a increases in a stepped fashion from $V_{B1}$, $V_{B2}$, $V_{B3}$, $V_{B4}$ between each of the control pulses applied to the word line 736a. Although the voltage on the bit line increases in a stepped fashion, as used herein the voltage on the bit line is considered to be a pulse when the control voltage pulse is sufficient turn on the access transistor and cause current to flow along path 751 through the memory element 711. Thus, the stepped voltage on the bit line 726a is a fixed sequence of voltage pulses of increasing pulse height as used herein.

The fixed sequence of voltage pulses cause an increasing bit line-to-source voltage across the access transistor of the memory cell 701 for each subsequent pulse, and thus cause increasing current through the memory element 711 until change to the higher resistance reset state occurs. Additionally, the voltage pulses in the fixed sequence cause a voltage across the phase change memory element less than the threshold voltage $V_{TH}$ after the memory element 711 is in the higher resistance reset state. The voltages applied to the bit line 726a can be determined empirically for each embodiment.

In the embodiment of FIG. 10 the fixed sequence of voltage pulses applied across the memory cell having increasing pulse height involves increasing only the word line voltage, and in FIG. 12 the fixed sequence of voltage pulses applied across the memory cell having increasing pulse height involves increasing only the bit line voltage. More generally, the fixed sequence of voltage pulses of the reset operation 900 described herein may comprise varying the voltages applied to the bit line 726a and/or the word line 736a and/or the common line 796 to cause increasing current through the memory element 711 until change to the higher resistance state occurs.

Figure 13:
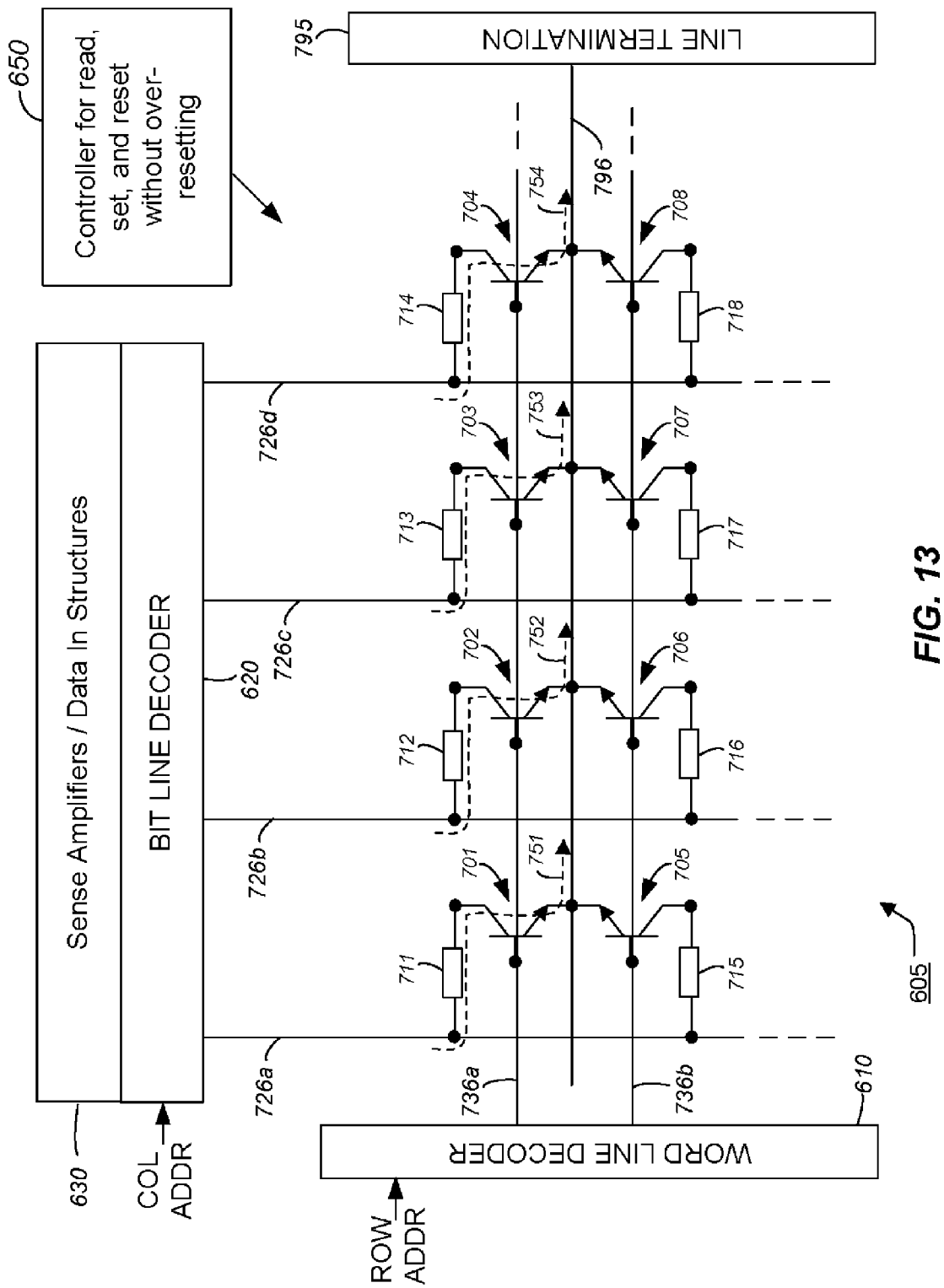
FIG. 13 illustrates a second embodiment of the array in which the memory cells are implemented using bipolar junction transistors.

In the discussion above the reset operation 900 was described with reference to the array 605 of FIG. 7 implemented using field effect transistors, although it will be understood that the present invention is not limited as such and that the reset operation 900 can be implemented using other types of access devices. FIG. 13 illustrates a second embodiment of the array 605 in which the memory cells are implemented using bipolar junction transistors, and the reset operation 900 discussed above with reference to FIGS. 8-12 can also be applied to the array 605 of FIG. 13. Thus, depending on the type of access transistor, as used herein the term "control terminal" refers to a gate terminal or a base terminal, and the term "conductive terminal" refers to source and drain terminals or emitter and collector terminals.

Figure 14:
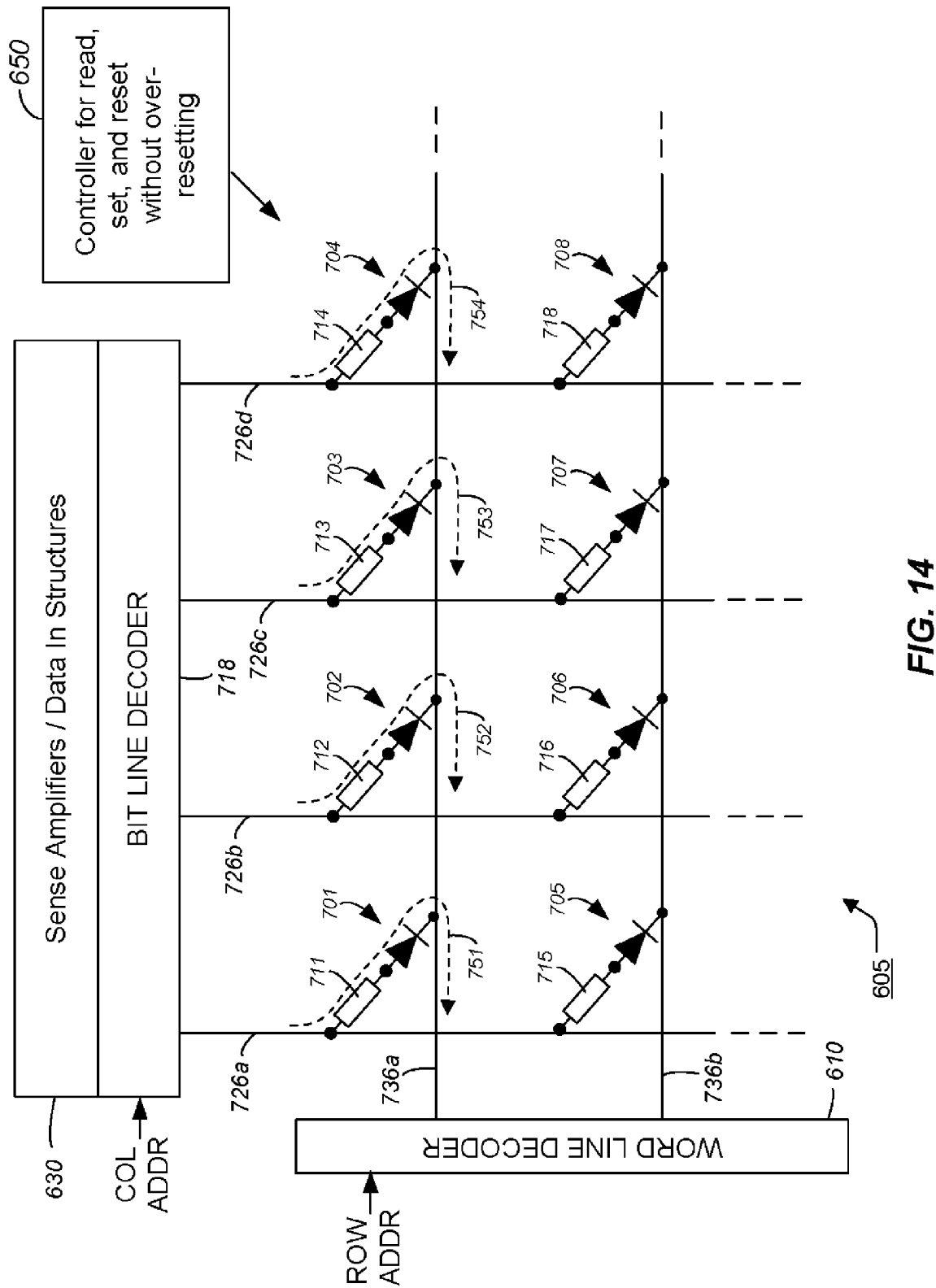
FIG. 14 illustrates a third embodiment of the array in which the memory cells are implemented using diode access devices.
Figure 15:
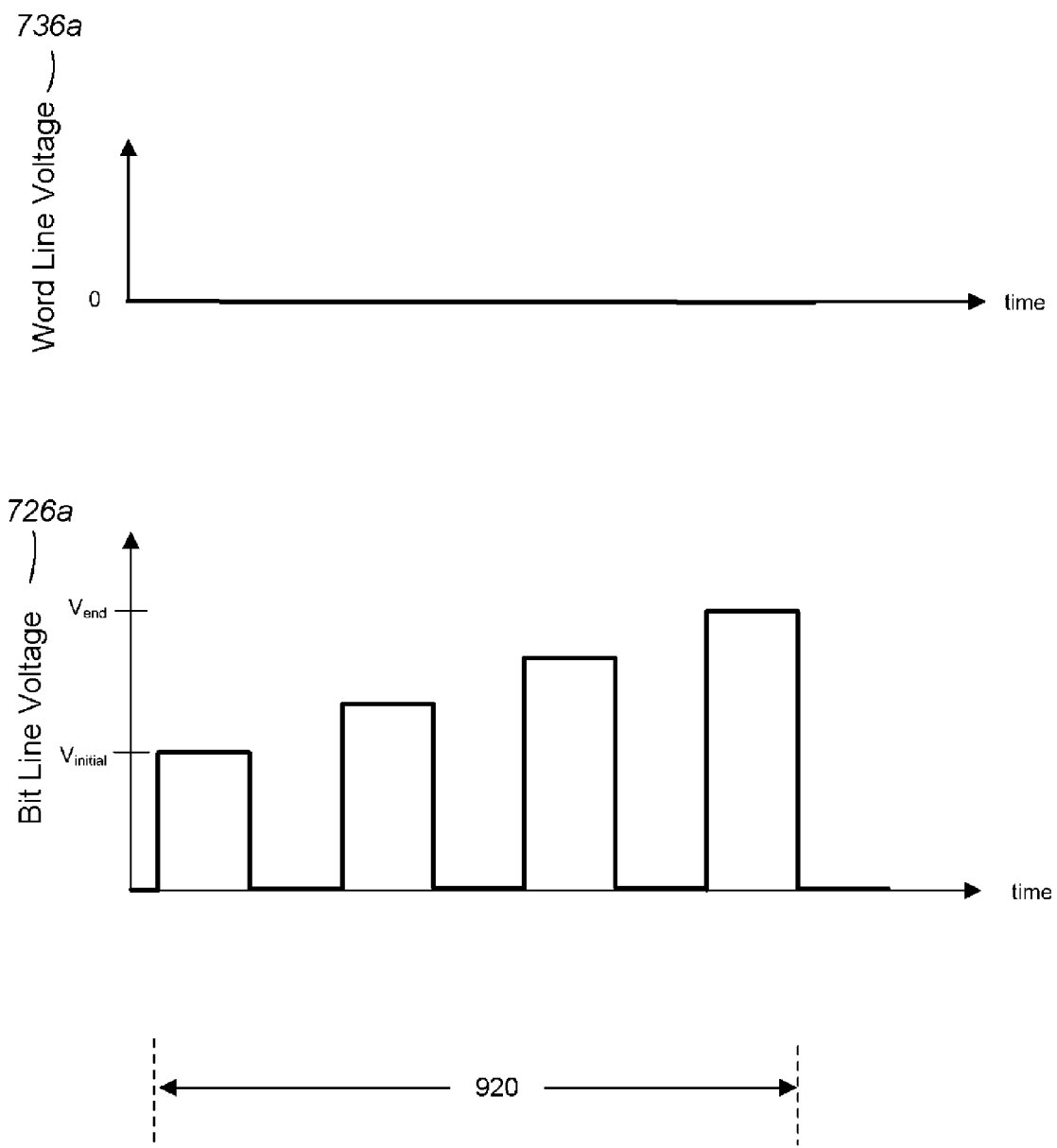
FIG. 15 illustrates a timing diagram of the reset operation of FIG. 9 for the memory cells of FIG. 14.

FIG. 14 illustrates a third embodiment of the array in which the memory cells are implemented using diode access devices, and FIG. 15 illustrates a simplified timing diagram of the reset operation 900 of FIG. 9 for the memory cells of FIG. 14.

In the timing diagram of FIG. 15 the fixed sequence of voltage pulses of increasing pulse height are applied to the bit line 726a and the word line 736a is supplied a constant voltage (ground in this example). Thus, the voltage pulses of increasing pulse height from $V_{initial}$ to $V_{end}$ are applied across the series arrangement of the diode and the memory element 711 for the memory cell 701 to cause increasing current in path 751 and through the memory element 711 until change to the higher resistance state occurs. Additionally, the voltage pulses in the fixed sequence are adapted to cause a voltage across the memory element 711 after the memory element 711 is in the higher resistance state that is less than the threshold voltage VTH. Thus, once the memory element 711 is in the higher resistance state the remaining voltage pulses of the fixed sequence are insufficient to change the resistance state back to the lower resistance state. The pulse heights and pulse widths of the various voltage pulses of the fixed sequence of voltage pulses can be determined empirically for each embodiment The reset operation 900 of FIG. 9 and the above descriptions refers to a single memory cell being reset, although it will be understood that the present invention is also applicable to resetting a plurality of memory cells in a block (or parallel) reset operation.

Figure 16:
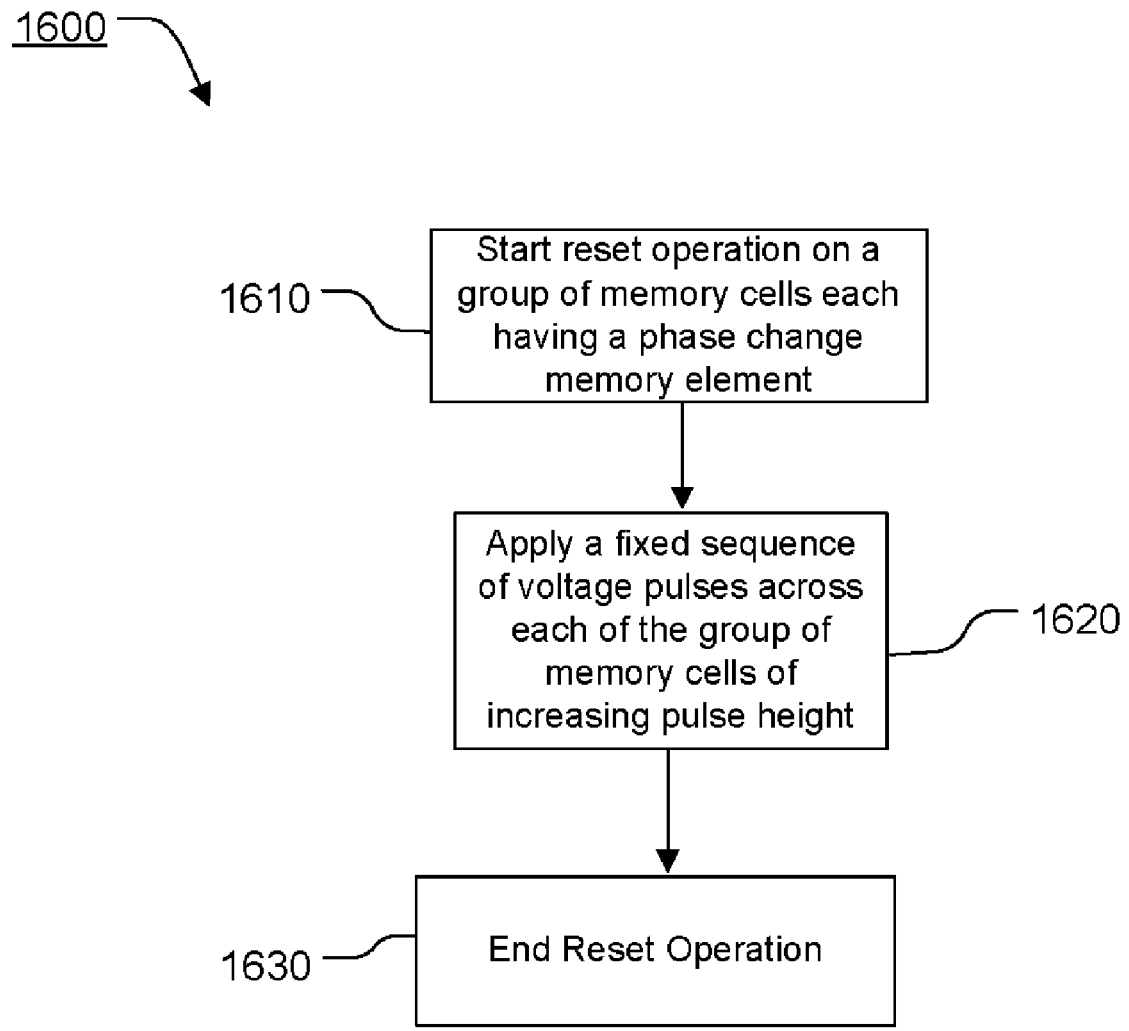
FIG. 16 is a flow diagram of a reset operation 1600 for resetting each memory cell in a group of memory cells of the array.
Figure 17:
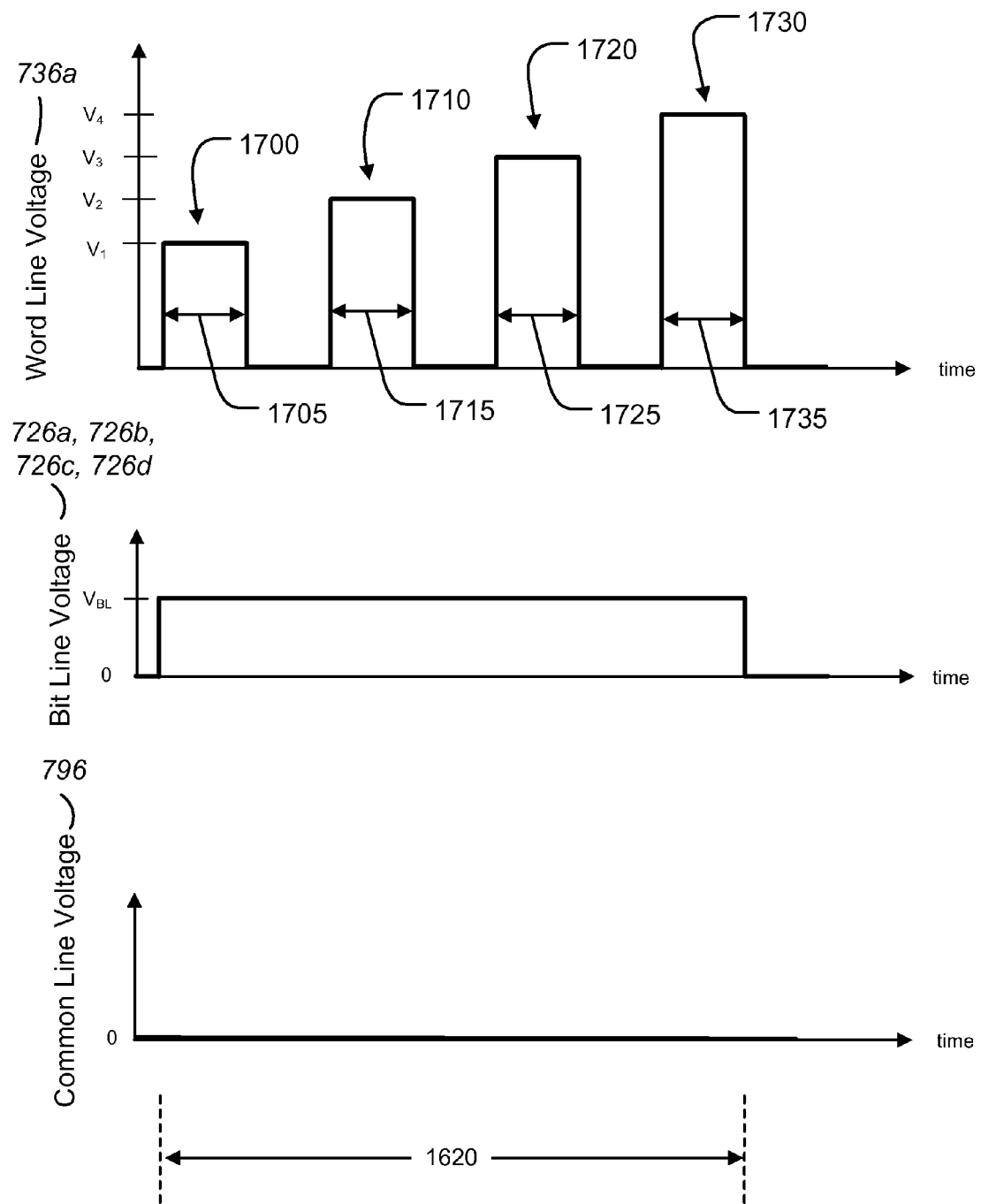
FIG. 17 is an embodiment of a timing diagram for a block reset operation of FIG. 16.

FIG. 16 is flow diagram of a reset operation 1600 for resetting each memory cell in a group of memory cells of array 605 at the same time (parallel reset), the reset operation 1600 providing the current needed to induce a phase change to the high resistance reset state for each memory cell in the array 605 while also avoiding the use of unnecessarily high reset currents. Thus, the reset operation 1600 can avoid the "over-reset" issues discussed above and result in improved reliability and improved data storage performance for the array. FIG. 17 illustrates a first embodiment of a timing diagram of the reset operation 1600 of FIG. 16 for doing a parallel reset operation on memory cells 701-704 of FIG. 7 along word line 736a. Although four memory cells are reset in this example, it will be understood that the reset operation 1600 can be used to reset many more memory cells.

The reset operation 1600 of a selected group of memory cells (in this example memory cells 701-704 having corresponding memory elements 711-714) in the array 605 begins at step 1610.

Next, at block 1620 a fixed sequence of voltage pulses are applied across each of the memory cells 701-704 of increasing pulse height to change the resistance state of the memory element 711 from the lower resistance state to the higher reset resistance state.

In the illustrated embodiment of FIG. 17, the fixed sequence of voltage pulses consists of four voltage pulses 1700, 1710, 1720, 1730. However, it will be understood that the present invention is not limited as such and more generally a fixed sequence of two or more voltage pulses may be used.

Successive voltage pulses in the fixed sequence provide increasing current through respective memory elements 711-714 until change to the higher resistance reset state occurs in the respective memory elements 711-714. The timing between successive voltage pulses in the fixed sequence is sufficient to allow the phase change material to allow for the quenching of the phase change process.

Additionally, the voltage pulses in the fixed sequence are adapted to cause a voltage across the respective memory elements 711-714 after the memory elements 711-714 are respectively in the higher resistance state that is less than the threshold voltage $V_{TH}$. Thus, once a particular memory element in the group is reset to the higher resistance state by a particular voltage pulse, the remaining voltage pulses of the fixed sequence are insufficient to change that particular memory element the resistance state from the higher resistance state. The pulse heights and pulse widths of the various voltage pulses of the fixed sequence of voltage pulses can be determined empirically for each embodiment.

The four voltage pulses 1700, 1710, 1720, 1730 have increasing pulse heights starting from an initial pulse height $V_1$ to a final pulse height $V_4$, and the common line 796 coupled to the source terminal is supplied a ground potential. The fixed sequence of voltage pulses cause an increasing gate-to-source voltage across the corresponding access transistors of the respective memory cells 701-704 for each subsequent pulse, and thus cause increasing current through the corresponding memory element 711-714 until change to the higher resistance reset state occurs.

In FIG. 17 the bit lines 726a, 726b, 726c, 726d are each supplied and maintained at a constant voltage $V_{BL}$ during the fixed sequence of voltage pulses. The voltage $V_{BL}$ is high enough to allow for sufficient current to reset the memory elements 711-714, and is low enough that the resultant voltage across the memory elements 711-714 caused by the fixed sequence of voltage pulses is less than the threshold voltage after the respective memory elements 711-714 have been reset.

Each voltage pulse 1700, 1710, 1720, 1730 in the fixed sequence cause a current sufficient to reset a corresponding group of memory cells which require increasing amounts of reset current, beginning with the lowest group 806 of FIG. 8 requiring the smallest amount of reset current and ending with the highest group 836 requiring the largest amount of reset current. As a result, the reset operation 1600 of each memory cell in the array can be reset with a current close to the necessary reset current, thereby avoiding the use of unnecessarily high current levels.

The first voltage pulse 1700 in the fixed sequence applied to the word lines 736a has a pulse height $V_1$ and a pulse width 1705, and is adapted to reset a first group of memory cells 806 of FIG. 8 which require a lowest reset current of $I_1$ 805 or less.

The second voltage pulse 1710 in the fixed sequence applied to the word line 736a has a pulse height $V_2$ and a pulse width 1715, and is sufficient to reset memory cells which require a reset current of $I_2$ 815 or less. The second voltage pulse 1710 is adapted to also cause a voltage across the memory elements 711-714 less than the threshold voltage $V_{TH}$ if the memory elements 711-714 are already in the higher resistance reset state. Therefore, the second voltage pulse is adapted to reset a second group of memory cells 816 of FIG. 8 which require a reset current between $I_2$ 815 and $I_1$ 805.

The third voltage pulse 1720 in the fixed sequence applied to the word line 736a has a pulse height $V_3$ and a pulse width 1725, and is sufficient to reset memory cells which require a reset current of $I_3$ 825 or less. The third voltage pulse 1720 is adapted to also cause a voltage across the memory elements 711-714 less than the threshold voltage $V_{TH}$ if the memory elements 711-714 are already in the higher resistance reset state. Therefore, the third voltage pulse is adapted to reset a second group of memory cells 816 of FIG. 8 which require a reset current between $I_3$ 825 and $I_2$ 815.

The fourth and final voltage pulse 1730 in the fixed sequence applied to the word line 736a has a pulse height $V_4$ and a pulse width 1735, and is sufficient to reset memory cells all of the memory cells in the array 605. The fourth voltage pulse 1030 is adapted to also cause a voltage across the memory elements 711-714 less than the threshold voltage $V_{TH}$ if the memory elements 711-714 are already in the higher resistance reset state. Therefore, the fourth voltage pulse is adapted to reset the fourth group of memory cells 836 of FIG. 8 which require a reset current between $I_4$ 835 and $I_3$ 825. The reset operation 1600 ends at step 1630.

Figure 18:
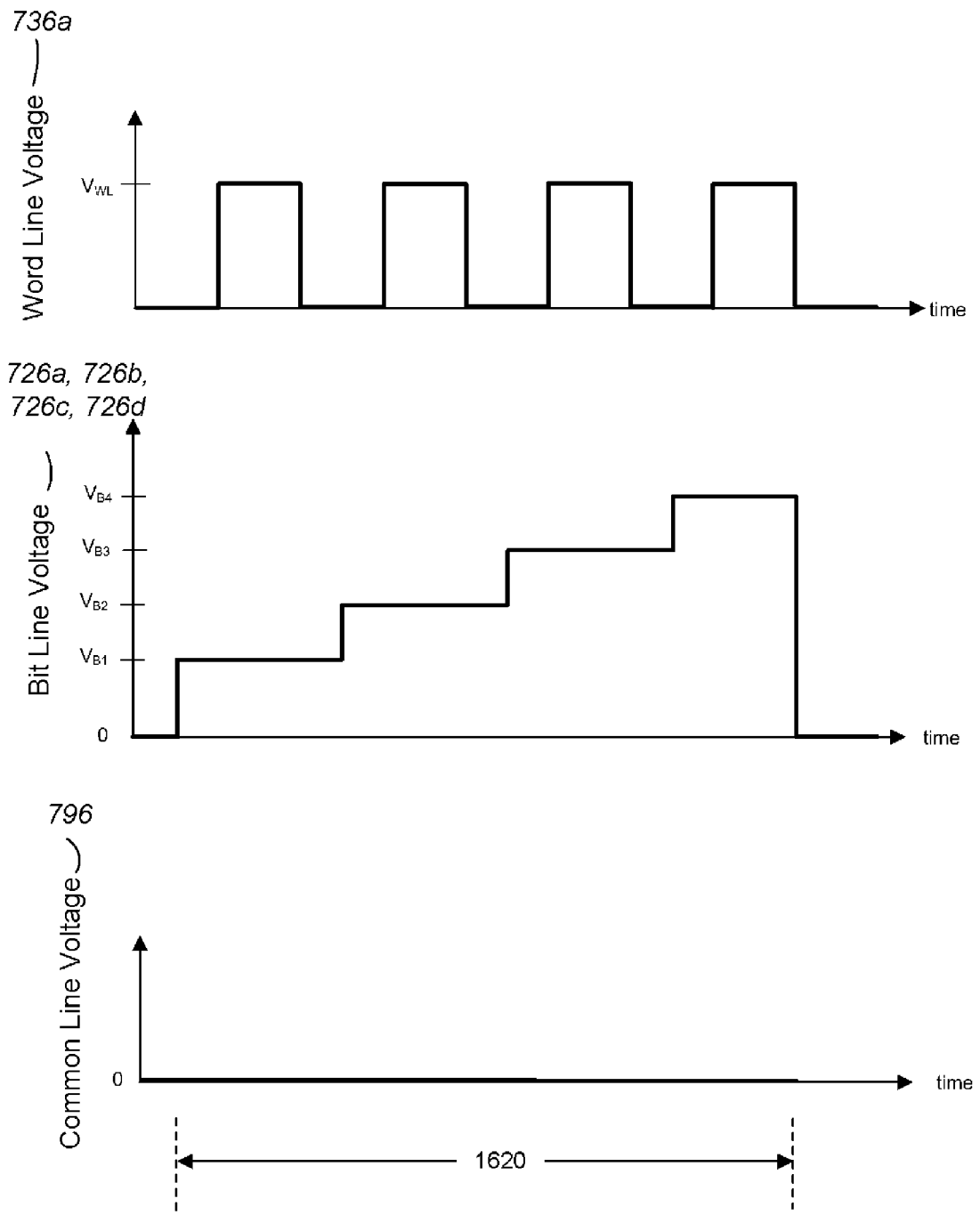
FIG. 18 is a second embodiment of a timing diagram for a block reset operation of FIG. 16.

In the timing diagram of FIG. 17 the voltage pulses of increasing pulse height were applied between the word line 736a and the common line 796. FIG. 18 illustrates a second embodiment of a timing diagram of the reset operation 1600 of FIG. 16 in which the voltage pulses of increasing pulse height are applied between the bit lines 726a, 726b, 726c, 726d, and the common line 796.

In FIG. 18, a series of four control voltage pulses having substantially the same pulse height $V_{WL}$ sufficient to turn on each of the access transistors of the memory cells 701-704 are applied to the word line 736a, and the common line 796 coupled to the source terminal is supplied a ground potential.

As can be seen in FIG. 18, the voltage on the bit lines 726a, 726b, 726c, 726d increases in a stepped fashion from $V_{B1}$, $V_{B2}$, $V_{B3}$, $V_{B4}$ between each of the control pulses applied to the word line 736a. Although the voltage on the bit lines increases in a stepped fashion, as used herein the voltage on the bit lines is considered to be a pulse when the control voltage pulse is sufficient turn on the access transistors and cause current to flow along respective paths 751-754 through the memory elements 711-714. Thus, the stepped voltage on the bit lines 726a, 726b, 726c, 726d is a fixed sequence of voltage pulses of increasing pulse height as used herein.

The fixed sequence of voltage pulses cause an increasing bit line-to-source voltage across each of the access transistors of the memory cells 701-704 for each subsequent pulse, and thus cause increasing current through the memory elements 711-714 until change to the higher resistance reset state respectively occurs. Additionally, the voltage pulses in the fixed sequence cause a voltage across each phase change memory elements less than the threshold voltage $V_{TH}$ after each memory elements 711-714 is in the higher resistance reset state. The voltages applied to the bit lines 726a, 726b, 726c, 726d can be determined empirically for each embodiment.

In the embodiment of FIG. 17 the fixed sequence of voltage pulses applied across the memory cells in the group having increasing pulse height involves increasing only the word line voltage, and in FIG. 18 the fixed sequence of voltage pulses applied across the memory cells in the group having increasing pulse height involves increasing only the voltage on the bit lines. More generally, the fixed sequence of voltage pulses of the reset operation 1600 described herein may comprise varying the voltages applied to the bit lines 726a, 726b, 726c, 726d, and/or the word line 736a and/or the common line 796 to cause increasing current through each of the memory elements 711-714 until respective change to the higher resistance state occurs.

In the discussion above the memory cells in the group were arranged along the word line 736a. In alternative embodiments, the arrangement of the groups of cells that are block reset 1600 may be different.

As will be understood, alternative embodiments for the pulses and array configurations including access devices which can be used with the reset operation 1600 of FIG. 16 include those discussed above with reference to FIGS. 8-15.

Embodiments of the memory cells described herein include phase change based memory materials, including chalcogenide based materials and other materials, for the memory elements. Chalcogens include any of the four elements oxygen (O), sulfur (S), selenium (Se), and tellurium (Te), forming part of group VIA of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from group IVA of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_a Ge_b Sb_{100-(a-b)}$. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky U.S. Pat. No. 5,687,112, cols. 10-11.) Particular alloys evaluated by another researcher include Ge2Sb2Te5, GeSb2Te4 and GeSb4Te7 (Noboru Yamada, "Potential of Ge—Sb—Te Phase-Change Optical Disks for High-Data-Rate Recording", SPIE v. 3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

Chalcogenides and other phase change materials are doped with impurities in some embodiments to modify conductivity, transition temperature, melting temperature, and other properties of memory elements using the doped chalcogenides. Representative impurities used for doping chalcogenides include nitrogen, silicon, oxygen, silicon dioxide, silicon nitride, copper, silver, gold, aluminum, aluminum oxide, tantalum, tantalum oxide, tantalum nitride, titanium and titanium oxide. See, e.g., U.S. Pat. No. 6,800,504, and U.S. Patent Application Publication No. U.S. 2005/0029502.

Phase change alloys are capable of being switched between a first structural state in which the material is in a generally amorphous solid phase, and a second structural state in which the material is in a generally crystalline solid phase in its local order in the active channel region of the cell. These alloys are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states.

Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change alloys can be changed from one phase state to another by application of electrical pulses. It has been observed that a shorter, higher amplitude pulse tends to change the phase change material to a generally amorphous state. A longer, lower amplitude pulse tends to change the phase change material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined, without undue experimentation, specifically adapted to a particular phase change alloy. In following sections of the disclosure, the phase change material is referred to as GST, and it will be understood that other types of phase change materials can be used. A material useful for implementation of a PCRAM described herein is $Ge_2 Sb_2 Te_5$.

An exemplary method for forming chalcogenide material uses chemical vapor deposition CVD such as that disclosed in US Publication No 2006/0172067 entitled "Chemical Vapor Deposition of Chalcogenide Materials", which is incorporated by reference herein.

A post-deposition annealing treatment in a vacuum or in an N2 ambient is optionally performed to improve the crystallized state of chalcogenide material. The annealing temperature typically ranges from 100° C. to 400° C. with an anneal time of less than 30 minutes.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method for operating a memory device comprising a memory cell comprising a phase change memory element programmable to a plurality of resistance states including a higher resistance state and a lower resistance state, the phase change memory element having a threshold voltage above which a transition begins from the higher resistance state to the lower resistance state, the method comprising:

applying a fixed sequence of voltage pulses across the memory cell of increasing pulse height to change the resistance state from the lower resistance state to the higher resistance state, the fixed sequence of voltage pulses causing increasing current through the phase change memory element until change to the higher resistance state occurs, and after the change the voltage pulses in the fixed sequence causing a voltage across the phase change memory element less than the threshold voltage.

2. The method of claim 1, wherein:

the memory cell further comprises a diode arranged electrically in series with the phase change memory element; and the applying a fixed sequence of voltage pulses across the memory cell comprises applying the fixed sequence of voltage pulses of increasing pulse height across the series arrangement of the diode and the phase change memory element.

3. The method of claim 1, wherein:
the memory cell further comprises a transistor having a control terminal and first and second conduction terminals, the phase change memory element arranged along a current path between the first conduction terminal and a bit line; and
the applying the fixed sequence of voltage pulses across the memory cell comprises applying the fixed sequence of voltage pulses of increasing pulse height from the control terminal to the second conduction terminal.

4. The method of claim 3, wherein the applying the fixed sequence of voltage pulses of increasing pulse height from the control terminal to the second conduction terminal comprises:
applying a constant voltage to the second conduction terminal; and
applying the fixed sequence of voltage pulses of increasing pulse height to the control terminal.

5. The method of claim 3, further comprising maintaining a voltage on the bit line between applying the voltage pulses in the fixed sequence of voltage pulses.

6. The method of claim 3, wherein the transistor is a field effect transistor, the control terminal is a gate terminal of the field effect transistor, and the first and second conduction terminals are drain and source terminals of the field effect transistor respectively.

7. The method of claim 3, wherein the transistor is a bipolar junction transistor, the control terminal is a base terminal of the bipolar junction transistor, and the first and second conduction terminals are collector and emitter terminals of the bipolar junction transistor respectively.

8. The method of claim 1, wherein:
the memory cell further comprises an transistor having a control terminal and first and second conduction terminals, the phase change memory element arranged along a current path between the first conduction terminal and a bit line; and
the applying the fixed sequence of voltage pulses across the memory cell comprises applying the fixed sequence of voltage pulses of increasing pulse height from the bit line to the second conduction terminal.

9. The method of claim 8, wherein the applying the fixed sequence of voltage pulses of increasing pulse height from the bit line to the second conduction terminal comprises:
applying a constant voltage to the second conduction terminal;
applying a series of control voltage pulses having substantially the same pulse height to the control terminal; and
applying an increased voltage to the bit line between applying control voltage pulses in the series.

10. The method of claim 8, wherein the transistor is a field effect transistor, the control terminal is a gate terminal of the field effect transistor, and the first and second conduction terminals are drain and source terminals of the field effect transistor respectively.

11. The method of claim 8, wherein the transistor is a bipolar junction transistor, the control terminal is a base terminal of the bipolar junction transistor, and the first and second conduction terminals are collector and emitter terminals of the bipolar junction transistor respectively.

12. The method of claim 1, wherein timing between successive voltage pulses in the fixed sequence is sufficient to allow for quenching of the change to the higher resistance state.

13. The method of claim 1, wherein no read operation is performed between applying the voltage pulses in the fixed sequence of voltage pulses.

14. The method of claim 1, wherein:
the memory device further comprises a plurality of memory cells, each memory cell in the plurality of memory cells comprising a phase change memory element programmable to a plurality of resistance states including a higher resistance state and a lower resistance state, each phase change memory element having a threshold voltage above which a transition begins from the higher resistance state to the lower resistance state; and
the applying the fixed sequence of voltage pulses comprises applying the fixed sequence of voltage pulses across each memory cell in the plurality of memory cells to change the resistance state of each of the corresponding phase change memory elements from the lower resistance state to the higher resistance state, the fixed sequence of voltage pulses causing increasing current through respective phase change memory elements until change to the higher resistance state occurs, and after the change the voltage pulses in the fixed sequence causing a voltage across respective phase change memory elements less than the threshold voltage.

15. The method of claim 14, wherein memory cells in the plurality of memory cells further comprise a transistor having a control terminal and first and second conduction terminals, the respective phase change memory elements arranged along a current path between the corresponding first conduction terminal and a corresponding bit line; and
the applying the fixed sequence of voltage pulses across each memory cell in the plurality of memory cells comprises applying the fixed sequence of voltage pulses of increasing pulse height from the corresponding control terminal to the corresponding second conduction terminal of each memory cell in the plurality of memory cells.

16. The method of claim 14, wherein memory cells in the plurality of memory cells further comprise a transistor having a control terminal and first and second conduction terminals, the respective phase change memory elements arranged along a current path between the corresponding first conduction terminal and a corresponding bit line; and
the applying the fixed sequence of voltage pulses across each memory cell in the plurality of memory cells comprises applying the fixed sequence of voltage pulses of increasing pulse height from the corresponding bit line to the corresponding second conduction terminal of each memory cell in the plurality of memory cells.

17. A memory device comprising:
a memory cell comprising a phase change memory element programmable to a plurality of resistance states including a higher resistance state and a lower resistance state, the phase change memory element having a threshold voltage above which a transition begins from the higher resistance state to the lower resistance state; and
bias circuitry adapted to apply a fixed sequence of voltage pulses across the memory cell of increasing pulse height to change the resistance state from the lower resistance state to the higher resistance state, the fixed sequence of voltage pulses causing increasing current through the phase change memory element until change to the higher resistance state occurs, and after the change the voltage pulses in the fixed sequence causing a voltage across the phase change memory element less than the threshold voltage.

18. The device of claim 17, wherein:
the memory cell further comprises a diode arranged electrically in series with the phase change memory element; and
the fixed sequence of voltage pulses across the memory cell comprise the fixed sequence of voltage pulses of increasing pulse height across the series arrangement of the diode and the phase change memory element.

19. The device of claim 17, wherein:
the memory cell further comprises a transistor having a control terminal and first and second conduction terminals, the phase change memory element arranged along a current path between the first conduction terminal and a bit line; and
the fixed sequence of voltage pulses across the memory cell comprise the fixed sequence of voltage pulses of increasing pulse height from the control terminal to the second conduction terminal.

20. The device of claim 19, wherein the fixed sequence of voltage pulses of increasing pulse height from the control terminal to the second conduction terminal comprise:
a constant voltage to the second conduction terminal; and
the fixed sequence of voltage pulses of increasing pulse height to the control terminal.

21. The device of claim 19, wherein the bias circuitry is further adapted to maintain a voltage on the bit line between applying the voltage pulses in the fixed sequence of voltage pulses.

22. The device of claim 19, wherein the transistor is a field effect transistor, the control terminal is a gate terminal of the field effect transistor, and the first and second conduction terminals are drain and source terminals of the field effect transistor respectively.

23. The device of claim 19, wherein the transistor is a bipolar junction transistor, the control terminal is a base terminal of the bipolar junction transistor, and the first and second conduction terminals are collector and emitter terminals of the bipolar junction transistor respectively.

24. The device of claim 17, wherein:
the memory cell further comprises a transistor having a control terminal and first and second conduction terminals, the phase change memory element arranged along a current path between the first conduction terminal and a bit line; and
the fixed sequence of voltage pulses across the memory cell comprise the fixed sequence of voltage pulses of increasing pulse height from the bit line terminal to the second conduction terminal.

25. The device of claim 24, wherein the fixed sequence of voltage pulses of increasing pulse height from the bit line terminal to the control terminal comprise:
a constant voltage to the second conduction terminal;
a series of control voltage pulses having substantially the same pulse height to the control terminal; and
an increased voltage to the bit line between applying control voltage pulses in the series.

26. The device of claim 24, wherein the transistor is a field effect transistor, the control terminal is a gate terminal of the field effect transistor, and the first and second conduction terminals are drain and source terminals of the field effect transistor.

27. The device of claim 24, wherein the transistor is a bipolar junction transistor, the control terminal is a base terminal of the bipolar junction transistor, and the first and second conduction terminals are collector and emitter terminals of the bipolar junction transistor.

28. The device of claim 17, wherein timing between successive voltage pulses in the fixed sequence is sufficient to allow for quenching of the change to the higher resistance state.

29. The device of claim 17, wherein no read operation is performed between applying the voltage pulses in the fixed sequence of voltage pulses.

30. The device of claim 17, wherein:
the memory device further comprises a plurality of memory cells, each memory cell in the plurality of memory cells comprising a phase change memory element programmable to a plurality of resistance states including a higher resistance state and a lower resistance state, each phase change memory element having a threshold voltage above which a transition begins from the higher resistance state to the lower resistance state; and
the bias circuitry is further adapted to apply the fixed sequence of voltage pulses across each memory cell in the plurality of memory cells to change the resistance state of each of the corresponding phase change memory elements from the lower resistance state to the higher resistance state, the fixed sequence of voltage pulses causing increasing current through respective phase change memory elements until change to the higher resistance state occurs, and after the change the voltage pulses in the fixed sequence causing a voltage across respective phase change memory elements less than the threshold voltage.

31. The device of claim 30, wherein memory cells in the plurality of memory cells further comprise a transistor having a control terminal and first and second conduction terminals, the respective phase change memory elements arranged along a current path between the corresponding first conduction terminal and a corresponding bit line; and
the fixed sequence of voltage pulses across each memory cell in the plurality of memory cells comprise the fixed sequence of voltage pulses of increasing pulse height from the corresponding control terminal to the corresponding second conduction terminal of each memory cell in the plurality of memory cells.

32. The method of claim 30, wherein memory cells in the plurality of memory cells further comprise a transistor having a control terminal and first and second conduction terminals, the respective phase change memory elements arranged along a current path between the corresponding first conduction terminal and a corresponding bit line; and
the fixed sequence of voltage pulses across each memory cell in the plurality of memory cells comprise the fixed sequence of voltage pulses of increasing pulse height from the corresponding bit line to the corresponding second conduction terminal of each memory cell in the plurality of memory cells.

* * * * *